US011909171B2

(12) United States Patent
Chen et al.

(10) Patent No.: US 11,909,171 B2
(45) Date of Patent: Feb. 20, 2024

(54) LASER-INTEGRATED BALANCE DETECTION FOR SELF-MIXING INTERFEROMETRY

(71) Applicant: Apple Inc., Cupertino, CA (US)

(72) Inventors: Tong Chen, Fremont, CA (US); Fei Tan, San Jose, CA (US); Mingzhou Jin, Campbell, CA (US)

(73) Assignee: Apple Inc., Cupertino, CA (US)

( * ) Notice: Subject to any disclaimer, the term of this patent is extended or adjusted under 35 U.S.C. 154(b) by 357 days.

(21) Appl. No.: 17/219,744

(22) Filed: Mar. 31, 2021

(65) Prior Publication Data
US 2022/0320820 A1    Oct. 6, 2022

(51) Int. Cl.
| | |
|---|---|
| G01C 3/08 | (2006.01) |
| H01S 5/026 | (2006.01) |
| H01L 31/0352 | (2006.01) |
| H01S 5/183 | (2006.01) |
| H01S 5/34 | (2006.01) |

(Continued)

(52) U.S. Cl.
CPC ............ H01S 5/026 (2013.01); G01S 7/4812 (2013.01); G01S 7/4913 (2013.01); G01S 7/4916 (2013.01); G01S 7/4917 (2013.01); H01L 31/035236 (2013.01); H01S 5/18361 (2013.01); H01S 5/34 (2013.01)

(58) Field of Classification Search
None
See application file for complete search history.

(56) References Cited

U.S. PATENT DOCUMENTS

| | | |
|---|---|---|
| 6,233,045 B1 | 5/2001 | Suni |
| 6,936,486 B2 | 8/2005 | Cheng et al. |

(Continued)

FOREIGN PATENT DOCUMENTS

| | | | |
|---|---|---|---|
| CN | 108225543 A | * 6/2018 | .............. G01H 9/00 |
| EP | 1035423 | 9/2000 | |

(Continued)

OTHER PUBLICATIONS

International Search Report and Written Opinion dated Jul. 15, 2022, PCT/US2022/018049, 18 pages.

(Continued)

*Primary Examiner* — Mark Hellner
(74) *Attorney, Agent, or Firm* — Brownstein Hyatt Farber Schreck, LLP

(57) ABSTRACT

An optical sensor system includes a set of epitaxial layers formed on a semiconductor substrate. The set of epitaxial layers defines a semiconductor laser having a first multiple quantum well (MQW) structure. Electromagnetic radiation is generated by the first MQW structure, emitted from the first MQW structure, and self-mixed with a portion of the emitted electromagnetic radiation that is returned to the first MQW structure. The set of epitaxial layers also defines a second MQW structure operable to generate a first photocurrent responsive to detecting a first emission of the semiconductor laser, and a third MQW structure operable to generate a second photocurrent responsive to detecting a second emission of the semiconductor laser. The optical sensor system also includes a circuit configured to generate a self-mixing interferometry (SMI) signal by combining the first photocurrent and the second photocurrent.

20 Claims, 14 Drawing Sheets

(51) Int. Cl.
*G01S 7/481* (2006.01)
*G01S 7/4912* (2020.01)
*G01S 7/4913* (2020.01)

(56) References Cited

U.S. PATENT DOCUMENTS

| | | | |
|---|---|---|---|
| 6,936,498 | B2 | 8/2005 | Cheng et al. |
| 7,305,018 | B2 | 12/2007 | Otoma |
| 7,315,560 | B2 | 1/2008 | Lewis et al. |
| 8,264,284 | B2 | 9/2012 | Moench |
| 9,091,747 | B2 | 7/2015 | Pruijmboom |
| 9,726,474 | B2 | 8/2017 | Royo Royo et al. |
| 10,502,547 | B2 | 12/2019 | Baier et al. |
| 10,880,005 | B2 | 12/2020 | McLaurin et al. |
| 10,887,112 | B2 | 1/2021 | Chen |
| 11,112,235 | B2 | 9/2021 | Mutlu et al. |
| 11,543,235 | B2 | 1/2023 | Chen et al. |
| 11,549,799 | B2 | 1/2023 | Tan et al. |
| 2011/0064110 | A1* | 3/2011 | Gerlach ............. H01S 5/18347 372/50.21 |
| 2011/0126617 | A1 | 6/2011 | Bengoechea Apezteguia |
| 2019/0293543 | A1 | 9/2019 | Norgia et al. |
| 2019/0317639 | A1 | 10/2019 | Winkler et al. |
| 2019/0331473 | A1 | 10/2019 | Johnson et al. |
| 2019/0346360 | A1 | 11/2019 | Jutte et al. |
| 2020/0278426 | A1 | 9/2020 | Dummer et al. |
| 2020/0350744 | A1 | 11/2020 | Gerlach |
| 2020/0370879 | A1 | 11/2020 | Mutlu et al. |
| 2020/0403379 | A1 | 12/2020 | Huang et al. |
| 2021/0028603 | A1 | 1/2021 | Lee et al. |
| 2021/0104873 | A1 | 4/2021 | Gerlach |
| 2022/0082369 | A1 | 3/2022 | Spruit et al. |
| 2022/0155052 | A1 | 5/2022 | Mutlu et al. |

FOREIGN PATENT DOCUMENTS

| | | |
|---|---|---|
| EP | 1670105 | 6/2006 |
| EP | 3184991 | 6/2017 |
| WO | WO 20/002616 | 1/2020 |

OTHER PUBLICATIONS

Contreras et al., "Phase Shift Measurements Between Intensity and Frequency Modulations of a Self-Mixing Interferometer," *IEEE Photonics Technology Letters*, vol. 30, No. 22, Nov. 15, 2018, pp. 1909-1912.

Liess et al., "A miniaturized multidirectional optical motion sensor and input device based on laser self-mixing," Institute of Physics Publishing, *Measurement Science and Technology*, vol. 13, 2002, pp. 2001-2006.

Zhao et al., "Balanced Detection for Self-mixing Interferometry to Improve Signal-to-noise Ratio," 2017 International Conference on Optical Instruments and Technology: Advanced Laser Technology and Applications, *Proceeding of SPIE*, vol. 10619, 2017, 6 pages.

U.S. Appl. No. 17/219,779, filed Mar. 31, 2021, Chen et al.
U.S. Appl. No. 18/078,819, filed Dec. 9, 2022, Lin et al.
U.S. Appl. No. 18/142,812, filed May 3, 2023, Chen et al.
U.S. Appl. No. 18/143,869, filed May 5, 2023, Joshi et al.

* cited by examiner

LASER-INTEGRATED BALANCE DETECTION FOR SELF-MIXING INTERFEROMETRY

FIELD

The described embodiments generally relate to optical sensing and, more particularly, to optical sensing based on self-mixing interferometry (SMI).

BACKGROUND

Coherent optical sensing, including Doppler velocimetry and heterodyning, can be used to obtain spatial information for a target. Example targets include objects, surfaces, particles, and so on. Example spatial information includes presence, distance, velocity, size, surface properties, particle count, and so on. Coherent optical sensing can sometimes be used to obtain spatial information for a target with optical wavelength resolution, at quantum limit signal levels, and with considerably lower photon energy than time-of-flight optical sensing methods. Coherent optical sensing can also limit interference from external aggressors such as ambient light or light generated by light sources of other optical sensing systems.

Semiconductor lasers (e.g., edge-emitting lasers (EELs), vertical cavity surface-emitting lasers (VCSELs), or horizontal cavity surface-emitting lasers (HCSELs)) integrated with wafer-level or wafer-bonded photodetectors enable coherent optical sensing using a monolithic sensor structure. For example, a semiconductor laser may generate and emit electromagnetic radiation from a resonant cavity of the semiconductor laser, receive returned (e.g., reflected or scattered) electromagnetic radiation back into the resonant cavity, self-mix the generated and returned electromagnetic radiation within the resonant cavity, and produce an SMI signal that can be detected by an integrated photodetector (e.g., an intra-cavity, stacked, or adjacent photodetector) and used to determine spatial information for a target.

To provide the best SMI sensing, noise may need to be identified and suppressed. Noise that affects SMI sensing may include, for example, ambient noise, laser/photodetector nonlinearity noise, driver noise, laser relative intensity noise (RIN), optical sensor system noise (e.g., application-specific integrated circuit (ASIC) noise), quantum limit noise (shot noise), and so on.

SUMMARY

Embodiments of the systems, devices, methods, and apparatus described in the present disclosure use laser-integrated balance detection to reduce (or remove) noise from the SMI output of an SMI sensor. The noise that can be reduced (or removed) includes noise such as ambient noise, laser/photodetector nonlinearity noise (e.g., thermal noise), driver noise, laser RIN, and optical sensor system noise (e.g., ASIC noise). Balance detection is facilitated by integrating a pair of photodetectors with a laser, extracting photocurrents having opposite SMI excess phases from the photodetectors, and combining (e.g., subtracting) the photocurrents to remove common-mode noise. In various embodiments, the photodetectors may be integrated into a same epitaxial stack as the laser (e.g., on opposite sides of a VCSEL or HCSEL's resonant cavity), or formed adjacent each other within an epitaxial stack that includes the laser, or on a substrate.

In a first aspect, the present disclosure describes an optical sensor system. The optical sensor system may include a semiconductor substrate, and a set of epitaxial layers formed on the substrate. The set of epitaxial layers may define a semiconductor laser having a first multiple quantum well (MQW) structure. Electromagnetic radiation may be generated by the first MQW structure, emitted from the first MQW structure, and self-mixed with a portion of the emitted electromagnetic radiation that is returned to the first MQW structure. The set of epitaxial layers may also define a second MQW structure operable to generate a first photocurrent responsive to detecting a first emission of the semiconductor laser, and a third MQW structure operable to generate a second photocurrent responsive to detecting a second emission of the semiconductor laser. The optical sensor system may also include a circuit configured to generate a self-mixing interferometry (SMI) signal by combining the first photocurrent and the second photocurrent. The combining of the first photocurrent and the second photocurrent may remove, from the SMI signal, noise common to the first photocurrent and the second photocurrent.

In a second aspect, the present disclosure describes another optical sensor system. The optical sensor system may include a substrate; a first photodetector on the substrate; and a second photodetector on the substrate, laterally offset from the first photodetector. The optical sensor system may also include a semiconductor laser that is attached to the substrate, aligned with the first photodetector, and configured to make a first emission of electromagnetic radiation toward the first photodetector. The semiconductor laser may have a resonant cavity in which emitted electromagnetic radiation and returned electromagnetic radiation is self-mixed. The optical sensor system may also include an optical subsystem configured to receive a second emission of the semiconductor laser and redirect a portion of the second emission toward the second photodetector, and a noise-mitigating SMI signal channel configured to combine a first photocurrent from the first photodetector and a second photocurrent from the second photodetector.

In a third aspect, the present disclosure describes another optical sensor system. The optical sensor system may include a semiconductor substrate, and a set of epitaxial layers formed on the substrate. The set of epitaxial layers may define a semiconductor laser, a first photodetector, and a second photodetector. The semiconductor laser may have a resonant cavity parallel to the semiconductor substrate and parallel or orthogonal to a primary electromagnetic radiation emission axis of the semiconductor laser. The first photodetector may be positioned adjacent a first end of the resonant cavity and configured to receive a secondary electromagnetic radiation emission of the semiconductor laser. The second photodetector may be positioned adjacent a second end of the resonant cavity and configured to receive a tertiary electromagnetic radiation emission of the semiconductor laser. The optical sensor system may also include a circuit configured to generate an SMI signal by combining a first photocurrent generated by the first photodetector and a second photocurrent generated by the second photodetector. The first photocurrent and the second photocurrent may have opposite SMI excess phases.

In addition to the exemplary aspects and embodiments described above, further aspects and embodiments will become apparent by reference to the drawings and by study of the following description.

BRIEF DESCRIPTION OF THE DRAWINGS

The disclosure will be readily understood by the following detailed description in conjunction with the accompanying drawings, wherein like reference numerals designate like structural elements, and in which.

Figure 1A:
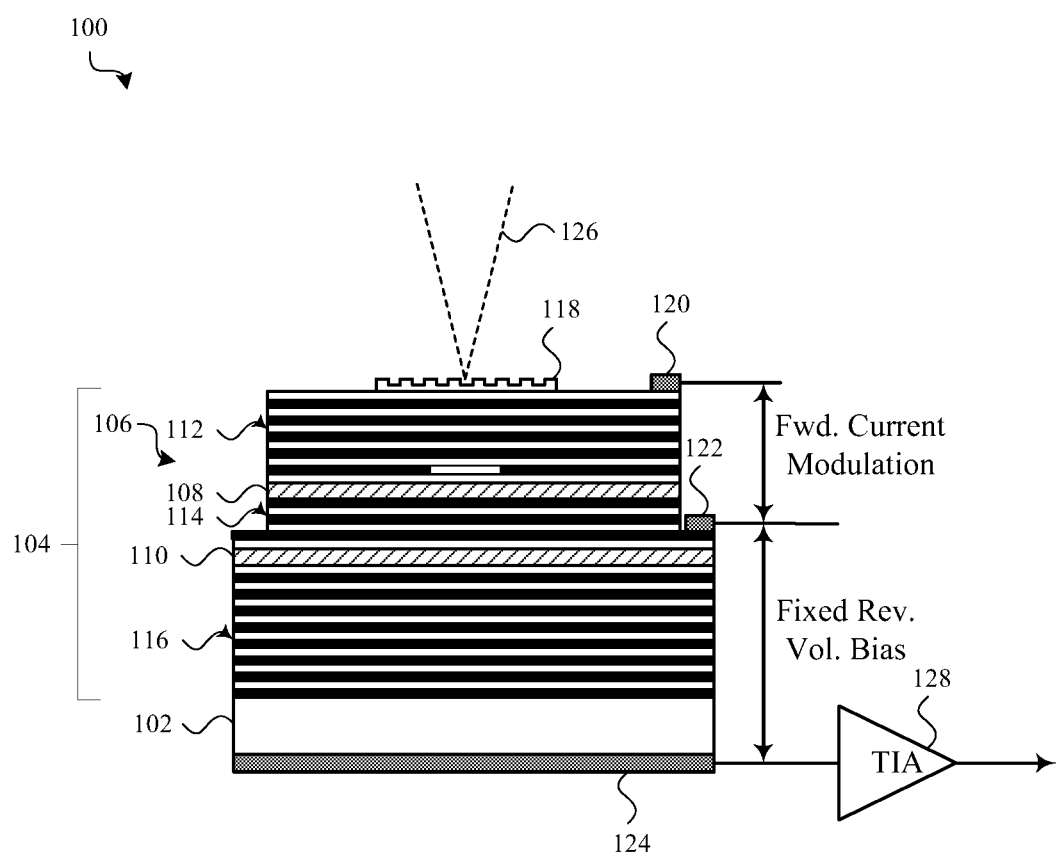
FIG. 1A shows an example of an optical sensor system that includes a semiconductor laser integrated with a photodetector.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Reference will now be made in detail to representative embodiments illustrated in the accompanying drawings. It should be understood that the following description is not intended to limit the embodiments to one preferred embodiment. To the contrary, it is intended to cover alternatives, modifications, and equivalents as can be included within the spirit and scope of the described embodiments as defined by the appended claims.

Balanced detection of an optical signal is one of the most efficient ways to reduce or remove noise from an optical signal. In a classical heterodyning detection scheme, the optical signal to be detected is coupled with a local oscillator signal and tapped to a two photon mixer. A 2×2 tap optical coupler then splits the detected optical signal into two phases. Subtracting the two phases amplifies (doubles) the optical signal and cancels the noise that is common to the two phases (i.e., the common-mode noise). Unfortunately, in an SMI-based optical sensor system, generated and returned electromagnetic radiation is self-mixed monolithically, within a laser's resonant cavity, before any phase-conjugate splitting of the optical signal to be detected (i.e., the SMI signal) can occur.

The following description relates to optical sensor systems that provide balanced detection for SMI sensors. In the described optical sensor systems, all of the active semiconductor devices of the SMI sensor may be formed on (or attached to) a common substrate. In some embodiments, a semiconductor laser and pair of photodetectors may be formed in a shared epitaxial stack, using a shared process, with each of the photodetectors being disposed along an emission axis of the semiconductor laser. In some embodiments, a semiconductor laser and a pair of photodetectors may be formed in a shared epitaxial stack, using a shared process, with a first of the photodetectors being disposed along an emission axis of the semiconductor laser and a second of the photodetectors being positioned adjacent the first photodetector (e.g., in a same one or more epitaxial layers). In some embodiments, the photodetectors may be formed on a same substrate, and an epitaxial stack including a semiconductor laser may be attached to the substrate such that the semiconductor laser is aligned with one of the photodetectors. In some embodiments, a semiconductor laser and pair of photodetectors may be formed in a shared epitaxial stack, using a shared process, with the semiconductor laser being formed as a HCSEL, and with the photodetectors being formed at opposite ends of a horizontal resonant cavity of the HCSEL.

The described optical sensor systems provide common-mode noise suppression for SMI sensors and reduce signal distortion. The described optical sensor systems also provide balance detection for a monolithic device and enable an SMI-based monolithic device to generate an SMI signal that is closer to the quantum limit of coherent detection.

These and other systems, devices, methods, and apparatus are described with reference to FIGS. 1A-7. However, those skilled in the art will readily appreciate that the detailed description given herein with respect to these figures is for explanatory purposes only and should not be construed as limiting.

Directional terminology, such as "top", "bottom", "upper", "lower", "front", "back", "over", "under", "above", "below", "left", "right", etc. is used with reference to the orientation of some of the components in some of the figures described below. Because components in various embodiments can be positioned in a number of different orientations, directional terminology is used for purposes of illustration only and is in no way limiting. The directional terminology is intended to be construed broadly, and therefore should not be interpreted to preclude components being oriented in different ways. Also, as used herein, the phrase "at least one of" preceding a series of items, with the term "and" or "or" to separate any of the items, modifies the list as a whole, rather than each member of the list. The phrase "at least one of" does not require selection of at least one of each item listed; rather, the phrase allows a meaning that includes at a minimum one of any of the items, and/or at a minimum one of any combination of the items, and/or at a minimum one of each of the items. By way of example, the phrases "at least one of A, B, and C" or "at least one of A, B, or C" each refer to only A, only B, or only C; any combination of A, B, and C; and/or one or more of each of A, B, and C. Similarly, it may be appreciated that an order of elements presented for a conjunctive or disjunctive list provided herein should not be construed as limiting the disclosure to only that order provided.

FIG. 1A shows a first example of an optical sensor system 100. The optical sensor system 100 includes a semiconductor substrate 102 on which a set of epitaxial layers 104 is formed. The set of epitaxial layers 104 defines a semiconductor laser 106 having a first multiple quantum well (MQW) structure 108. In some cases, the semiconductor laser 106 may be configured as a VCSEL. The set of epitaxial layers 104 also defines a second MQW structure 110. The first and second MQW structures 108, 110 may be formed within a distributed Bragg reflector (DBR) defined by the set of epitaxial layers 104. The DBR may include first, second, and third portions 112, 114, 116. The first MQW structure 108 may be formed between the first and second portions 112, 114 of the DBR, and the second MQW structure 110 may be formed between the second and third portions 114, 116 of the DBR. The first portion 112 of the DBR and/or the second and third portions 114, 116 of the DBR may be partially transmissive, or have an aperture, to allow electromagnetic radiation generated by the semiconductor laser 106 to escape from the set of epitaxial layers 104.

The first MQW structure 108, together with the DBR portions 112, 114, 116, may form a first resonant cavity, and in some cases may form a VCSEL. The second MQW structure 110, in combination with its neighboring DBR portions (e.g., 114/116) may form a second cavity, and in some cases may function as a resonant cavity photodetector (RCPD).

Optionally, a grating 118 or lens may be formed or deposited on an emission surface of the semiconductor laser 106 (or a coating or a surface treatment may be applied to the emission surface).

The first MQW structure 108 may be disposed between first and second electrodes 120, 122, such as a first electrode 120 disposed on a first (or upper) epitaxial layer in the set of epitaxial layers 104, and a second electrode 122 disposed on a second epitaxial layer in the set of epitaxial layers 104 (e.g., an epitaxial layer disposed between the first and second MQW structures 108, 110).

The second MQW structure 110 may be disposed between the second electrode 122 and a third electrode 124. The third electrode 124 may be formed on a side of the semiconductor substrate 102 opposite a side of the semiconductor substrate 102 on which the set of epitaxial layers 104 is formed.

In operation, the first MQW structure 108 may be forward-biased by a fixed or modulated drive current applied to the first electrode 120, and may be caused to generate electromagnetic radiation (i.e., lase). The second electrode 122 may be grounded or held at a fixed potential. The generated electromagnetic radiation may be emitted from the first MQW structure 108. If the emitted electromagnetic radiation 126 reflects or scatters off of a target (e.g., a surface, object, or particle), a portion of the reflected or scattered electromagnetic radiation may be reflected or scattered toward the semiconductor laser 106, and may be received back into (or returned to) the first MQW structure 108. When this occurs, the returned portion of the emitted electromagnetic radiation 126 may self-mix with the electromagnetic radiation that is generated by the first MQW structure 108. The self-mixing leads to changes in the emitted electromagnetic radiation 126, which changes can be detected by reverse-biasing the second MQW structure 110 with a fixed voltage bias (i.e., the second MQW structure 110 may be reverse-biased and operated as a photodetector (PD)); sensing a photocurrent generated by the second MQW structure 110 (e.g., a photocurrent generated at the third electrode 122); and extracting an SMI signal from the photocurrent. In some cases, the photocurrent may be received and amplified by a transimpedance amplifier (TIA) 128, and the output of the TIA 128 may be converted to a digital value by an analog-to-digital converter (ADC). In some cases, the output of the TIA 128 may be additionally amplified, filtered, or otherwise processed prior to being converted to a digital value.

Figure 1B:
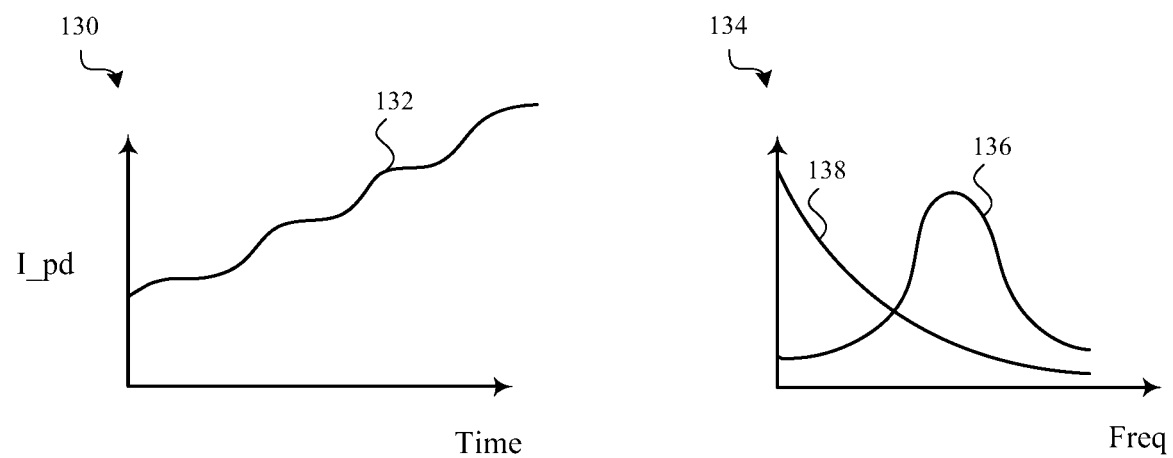
FIG. 1B shows an example graph of the photocurrent output by the transimpedance amplifier (TIA) shown in FIG. 1A, and a graph of the frequency response of an SMI signal extracted from the photo current.

FIG. 1B shows an example of the photocurrent (I_pd) output by the TIA 128. In particular, FIG. 1B shows a graph 130 of the photocurrent 132 output by the TIA 128 over time, and a graph 134 of the frequency response 136 of an SMI signal extracted from the photocurrent. As shown in the graph 134, noise 138 may interfere with the low frequency response of the SMI signal.

Figure 1C:
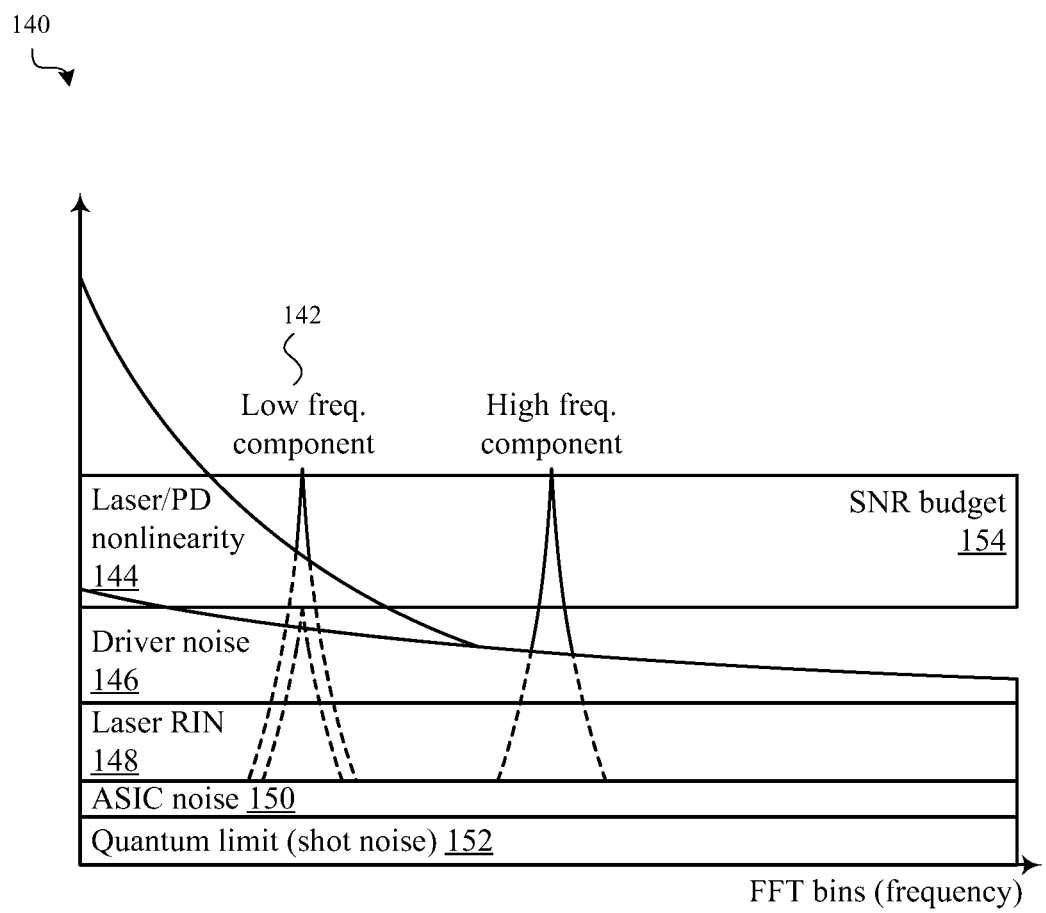
FIG. 1C shows an example graph of interference that may make it difficult to detect the lower frequency components of the SMI signal described with reference to FIGS. 1A and 1B.

FIG. 1C shows an example graph 140 of interference that may make it difficult to detect the lower frequency components 142 of the SMI signal. The interference may include laser/PD nonlinearity noise 144, driver noise 146, laser RIN 148, optical sensor system noise 150 (e.g., ASIC noise), and quantum limit noise 152 (shot noise). As shown, the cumulative noise 144-152 may be higher than the noise floor defined by the signal-to-noise ratio (SNR) budget 154 of the SMI signal at lower frequencies.

Figure 2A:
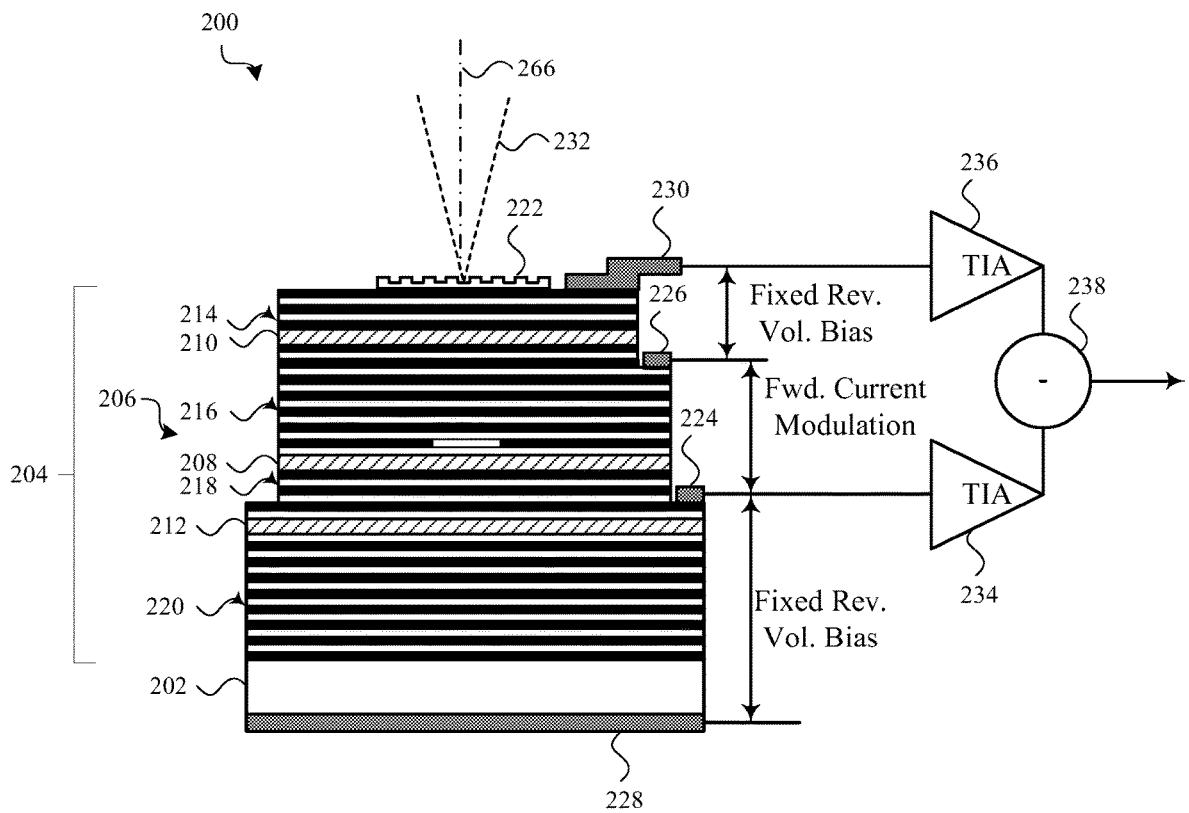
FIG. 2A shows an example of an optical sensor system that includes a semiconductor laser integrated with a pair of photodetectors.

FIG. 2A shows a second example of an optical sensor system 200. The optical sensor system 200 includes a semiconductor substrate 202 on which a set of epitaxial layers 204 is formed. The set of epitaxial layers 204 defines a semiconductor laser 206 having a first MQW structure 208. In some cases, the semiconductor laser 206 may be configured as a VCSEL. The set of epitaxial layers 204 also defines a second MQW structure 210 and a third MQW structure 212. The first, second, and third MQW structures 208, 210, 212 may be disposed along an emission axis 266 of the semiconductor laser 206, with the second MQW structure 210 being positioned on a first side of the first MQW structure 208, and with the third MQW structure 212 being positioned on a second side of the first MQW structure 208 (with the second side being opposite the first side).

The first, second, and third MQW structures 208, 210, 212 may be formed within a DBR defined by the set of epitaxial layers 204. The DBR may include first, second, third, and fourth portions 214, 216, 218, 220. The first MQW structure 208 may be formed between the second and third portions 216, 218 of the DBR. The second MQW structure 210 may be formed between the third and fourth portions 218, 220 of the DBR. The third MQW structure 212 may be formed between the first and second portions 214, 216 of the DBR. The first, second, third, and fourth portions 214, 216, 218, 220 of the DBR may be partially transmissive, or have an aperture, to allow electromagnetic radiation generated by the semiconductor laser 206 to escape from the set of epitaxial layers 204 in first and second emissions of electromagnetic radiation.

The first MQW structure 208, together with the DBR portions 214, 216, 218, 220, may form a first resonant cavity, and in some cases may form a VCSEL. The second and third MQW structures 210, 212, in combination with their neighboring DBR portions (e.g., 214/216, or 218/220) may form second and third cavities, and in some cases may function as RCPDs.

Optionally, a grating 222 or lens may be formed or deposited on an emission surface of the semiconductor laser 206 (or a coating or a surface treatment may be applied to the emission surface).

The first MQW structure 208 may be disposed between first and second electrodes 224, 226, such as a first electrode 224 disposed on a first epitaxial layer in the set of epitaxial layers 204 (e.g., an epitaxial layer disposed between the first and second MQW structures 208, 210), and a second electrode 226 disposed on a second epitaxial layer in the set of epitaxial layers 204 (e.g., an epitaxial layer disposed between the first and third MQW structures 208, 212).

The second MQW structure 210 may be disposed between the first electrode 224 and a third electrode 228, with the first electrode 224 being disposed between the second and third electrodes 226, 228. The third electrode 228 may be formed on a side of the semiconductor substrate 202 opposite a side of the semiconductor substrate 202 on which the set of epitaxial layers 204 is formed.

The third MQW structure 212 may be disposed between the second electrode 226 and a fourth electrode 230. The fourth electrode 230 may be disposed on a first (or upper) epitaxial layer in the set of epitaxial layers 204, with the second electrode 226 being disposed between the first and fourth electrodes 224, 230. A forward junction may be formed between the second MQW structure 210 and the second electrode 226, and/or between the third MQW structure 212 and the first electrode 224, to provide electrical isolation and proper contact polarity.

In operation, the third electrode 228 may be grounded or held at a fixed potential, and the first MQW structure 208 may be forward-biased by a fixed or modulated drive current applied to the second electrode 226. Forward-biasing the first MQW structure 208 may cause the first MQW structure 208 to generate electromagnetic radiation (i.e., lase). The generated electromagnetic radiation may be emitted from the first MQW structure 208. If the emitted electromagnetic radiation 232 reflects or scatters off of a target (e.g., a surface, object, or particle), a portion of the reflected or scattered electromagnetic radiation may be reflected or scattered toward the semiconductor laser 206, and may be received back into (or returned to) the first MQW structure 208. When this occurs, the returned portion of the emitted electromagnetic radiation 232 may self-mix with the electromagnetic radiation that is generated within the first MQW structure 208. The self-mixing leads to changes in the emitted electromagnetic radiation 232.

The changes in the emitted electromagnetic radiation 232 may be detected with a first SMI excess phase, from mixing with a first emission direction of the semiconductor laser 206, by reverse-biasing the second MQW structure 210 with a fixed voltage bias (i.e., the second MQW structure 210 may be reverse-biased and operated as an RCPD); sensing a photocurrent (a first photocurrent) generated by the second MQW structure 210 (e.g., a photocurrent generated at the first electrode 224); and extracting an SMI signal from the photocurrent. In some cases, the photocurrent may be received and amplified by a TIA 234.

The changes in the emitted electromagnetic radiation 232 may also be detected with a second SMI excess phase, from mixing with a second emission direction of the semiconductor laser 206, by reverse-biasing the third MQW structure 212 with a fixed voltage bias (i.e., the third MQW structure 212 may be reverse-biased and operated as a second RCPD); sensing a photocurrent (a second photocurrent) generated by the third MQW structure 212 (e.g., a photocurrent generated at the fourth electrode 230); and extracting an SMI signal from the photocurrent. In some cases, the photocurrent may be received and amplified by a TIA 236.

The optical sensor system 200 may be designed such that the first and second photocurrents have opposite SMI excess phases. Outputs of the TIAs 234, 236 may be combined (e.g., subtracted) by a set of one or more circuit components 238 (e.g., a summing node or other structure) to generate an SMI signal having less noise than the SMI signal extracted from the singular PD described with reference to FIG. 1A. The output of the set of one or more circuit components 238 may be converted to a digital value by a ADC. In some cases, the output of the set of one or more circuit components 238 may be additionally amplified, filtered, or otherwise processed prior to being converted to a digital value. The TIAs 234, 236, in combination with the set of one or more circuit components 238, are one example of a noise-mitigating SMI signal channel.

By combining first and second photocurrents having different phases, the TIAs 234, 236 and set of one or more circuit components 238 remove, from the SMI signal, noise that is common to the first and second photocurrents (i.e., common-mode noise). In an ideal system, all of the common-mode noise is removed. In a non-ideal system, some or most of the common-mode noise is removed. The TIAs 234, 236 and set of one or more circuit components 238 may therefore function as a noise-mitigating SMI signal channel Having a separate TIA 234, 236 for processing each photocurrent enables the TIAs 234, 236 to be separately tuned (during manufacture or, in some cases, in the field), providing more flexibility in phase and/or amplitude matching the outputs of the TIAs 234, 236. Tuning may be needed, for example, as a result of process variation, different doping, different thickness, or different electrical field power for the different MQW structures 208, 210. Such tuning can be performed automatically, when there is zero SMI, or when there is a known SMI (e.g., during a calibration process).

To improve the noise mitigation provided by the TIAs 234, 236 and set of one or more circuit components 238, the second and third MQW structures 210, 212 may be phase-matched and have similar thermal characteristics. Alternatively, the second MQW structure 210 may be designed to have less photo-absorption, thereby increasing the optical power of the primary emission 232, and the different characteristics of the second and third MQW structures 210, 212 can be accounted for in the designs of the TIAs 234, 236.

Figure 2B:
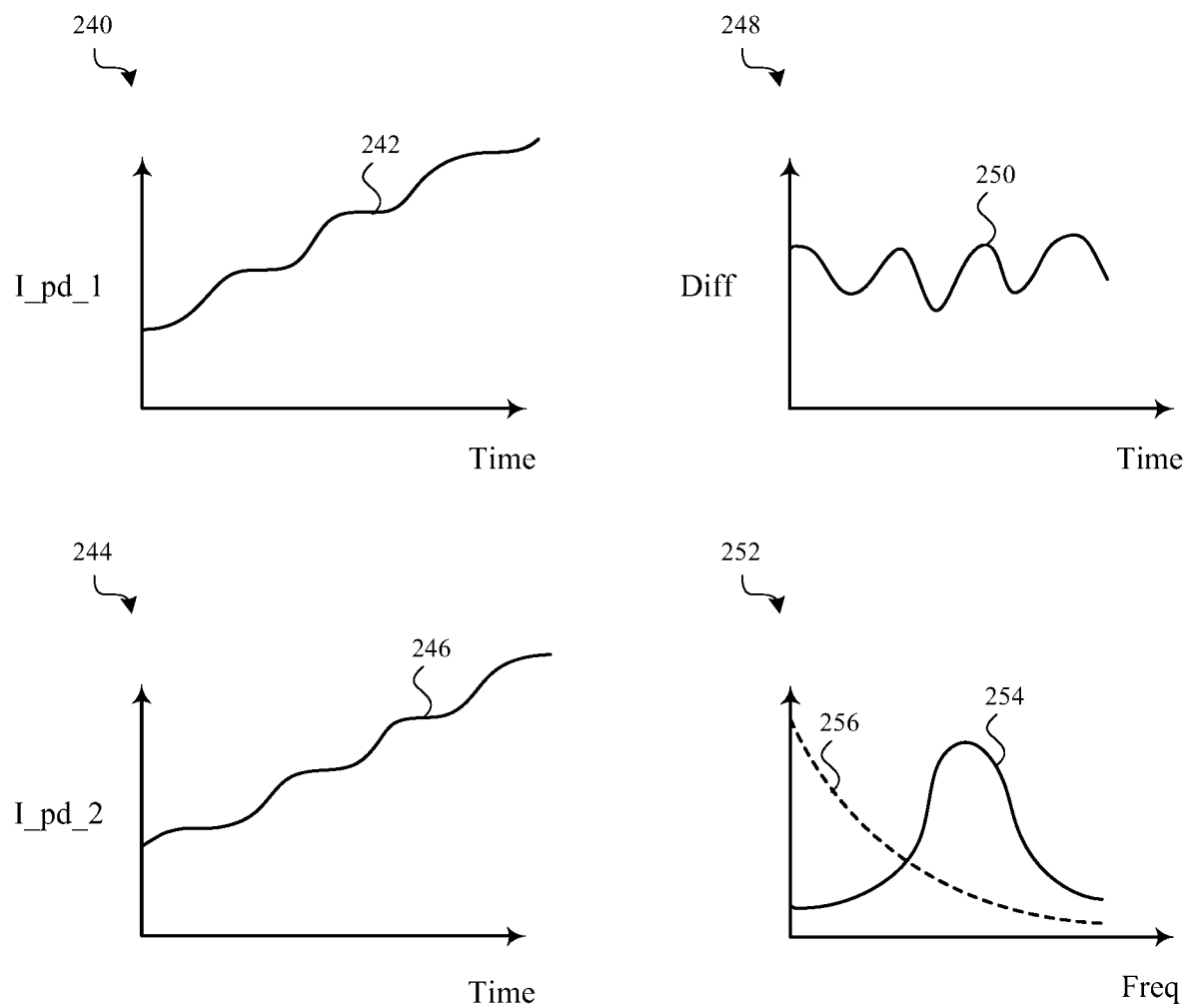
FIG. 2B shows example graphs of the photocurrents output by the TIAs shown in FIG. 2A, a graph of the combined photocurrents, and a graph of the frequency response of an SMI signal extracted from the combined photocurrents.

FIG. 2B shows an example of the photocurrents (I_pd_1 and I_pd_2) that are respectively output by the TIAs 234, 236. In particular, FIG. 2B shows a graph 240 of the photocurrent 242 output by the TIA 234 over time, and a graph 244 of the photocurrent 246 output by the TIA 236 over time. Also shown is a graph 248 of the combined photocurrent 250 output by the set of one or more circuit components 238, and a graph 252 of the frequency response 254 of an SMI signal extracted from the combined photocurrent 250. As shown by the hashed curve 256 in the graph 252, the noise described with reference to FIG. 1B may be eliminated or reduced by the optical sensor system 200, and may no longer interfere, or interfere less, with the low frequency response of the SMI signal.

Figure 2C:
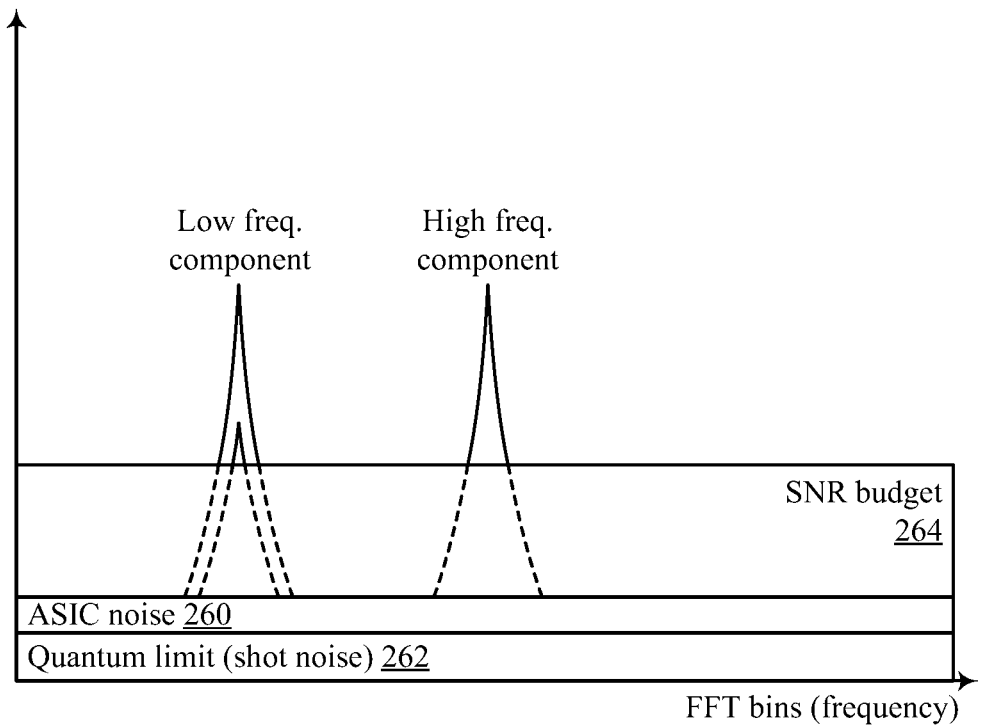
FIG. 2C shows an example graph of interference that may interfere with the SMI signal described with reference to FIGS. 2A and 2B.

FIG. 2C shows an example graph 258 of interference that may interfere with the SMI signal generated by the optical sensor system 200. The noise may include optical sensor system noise 260 (e.g., ASIC noise) and quantum limit noise 262 (shot noise), but may not include, or may include a reduced amount of, laser/PD nonlinearity noise, driver noise, and laser RIN. As shown, the cumulative noise 260, 262 may be lower than the noise floor defined by the SNR budget 264 of the SMI signal at lower frequencies.

In some cases, one or both of the second and third MQW structures 210, 212 shown in FIG. 2A may be alternatively operable to generate a photocurrent (as described above), or to generate electromagnetic radiation contemporaneously with the first MQW structure 208. For example, the noise discussed herein may be less of an issue when the first MQW structure 208 is driven with a DC or low frequency drive current. As another example, the noise may be less of an issue when the SMI frequency from target ranging or velocity are high and away from the high noise floor. In these scenarios, the second or third MQW structure 210, 212 may be forward-biased and used to generate additional electromagnetic radiation (i.e., to increase the optical power of the optical sensor system 200). Alternatively, one of the second or third MQW structures 210, 212 and its associated TIA 234 or 236 may be powered down or turned off.

In other cases, where SMI sensing does not need to be performed, both of the second and third MQW structures 210, 212 may be forward-biased to increase the optical power of the optical sensor system 200; or one or both of the second and third MQW structures 210, 212 and its associated TIA 234 or 236 may be powered down or turned off.

FIG. 2A shows an optical sensor system 200 in which the second and third MQW structures 210, 212 are positioned along an emission axis 266 of the semiconductor laser 206. In an alternative arrangement, the third MQW structure 212 may not intersect the emission axis 266. For example, the third MQW structure 212 may be positioned adjacent, or in-plane, with the second MQW structure 210, as described with reference to FIG. 3A.

Figure 3A:
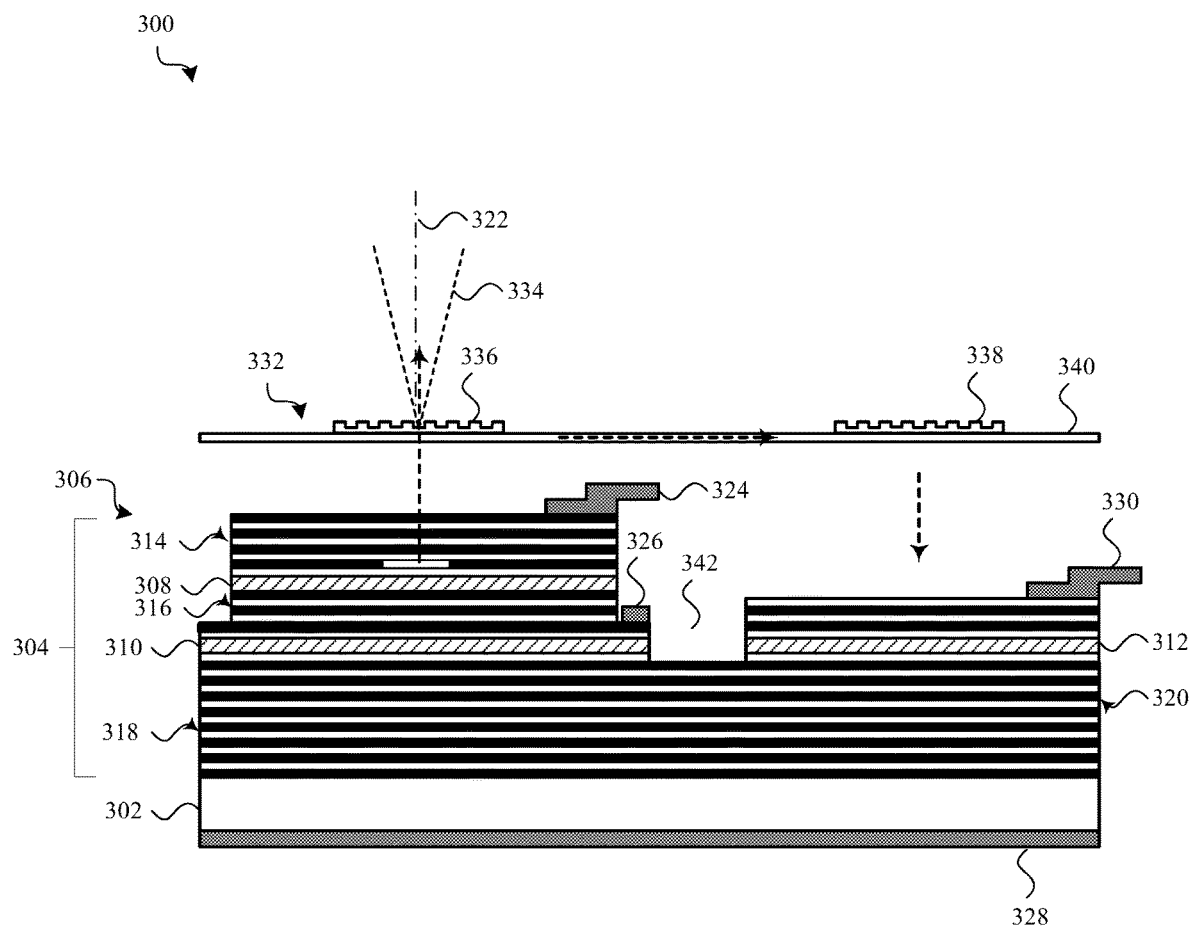
FIG. 3A shows an example of an optical sensor system that includes a semiconductor laser integrated with a pair of in-plane photodetectors, both of which are formed in a set of epitaxial layers.

FIG. 3A shows a third example of an optical sensor system 300. The optical sensor system 300 includes a semiconductor substrate 302 on which a set of epitaxial layers 304 is formed. The set of epitaxial layers 304 defines a semiconductor laser 306 having a first MQW structure 308. In some cases, the semiconductor laser 306 may be configured as a VCSEL. The set of epitaxial layers 304 also defines a second MQW structure 310 and a third MQW structure 312. The first and second MQW structures 308, 310 may be disposed along an emission axis 322 of the semiconductor laser 306, with the second MQW structure 310 being positioned between the semiconductor substrate 302 and the first MQW structure 308. The third MQW structure 312 may not be disposed along the emission axis 322, and may not intersect the emission axis 322. Instead, the third MQW structure 312 may be positioned adjacent an epitaxial stack including the first and second MQW structures 308, 310. In some embodiments, and as shown, the third MQW structure 312 may be positioned adjacent or in-plane with the second MQW structure 310, and may share a same set of epitaxial layers as the second MQW structure 310.

The first and second MQW structures 308, 310 may be formed within a DBR defined by the set of epitaxial layers 304. The DBR may include first, second, and third portions 314, 316, 318. The first MQW structure 308 may be formed between the first and second portions 314, 316 of the DBR. The second MQW structure 310 may be formed between the second and third portions 316, 318 of the DBR. The first, second, and third portions 314, 316, 318 of the DBR may be partially transmissive, or have an aperture, to allow electromagnetic radiation generated by the semiconductor laser 306 to escape from the set of epitaxial layers 304 in first and second emissions of electromagnetic radiation. In some cases, the third portion 318 of the DBR may extend under the third MQW structure 312, and the third MQW structure 312 may be formed within a DBR including the third portion 318 and a fourth portion 320.

The first MQW structure 308 may be disposed between first and second electrodes 324, 326, such as a first electrode 324 disposed on a first (or upper) epitaxial layer in the set of epitaxial layers 304, and a second electrode 326 disposed on a second epitaxial layer in the set of epitaxial layers 304 (e.g., an epitaxial layer disposed between the first and second MQW structures 308, 310).

The second MQW structure 310 may be disposed between the second electrode 326 and a third electrode 328. The third electrode 328 may be formed on a side of the semiconductor substrate 302 opposite a side of the semiconductor substrate 302 on which the set of epitaxial layers 304 is formed.

The third MQW structure 312 may be disposed between the third electrode 328 and a fourth electrode 330, with the fourth electrode 330 being disposed on a side of the third MQW structure 312 (and on an epitaxial layer) that is on a side of the third MQW structure 312 opposite a side on which the third electrode 328 is disposed.

An optical subsystem 332 may be formed over the first, second, and third MQW structures 308, 310, 312, opposite a side of the set of epitaxial layers 304 on which the semiconductor substrate 302 is positioned. In some embodiments, the optical subsystem 332 may allow a first portion of the electromagnetic radiation 334 emitted by the semiconductor laser 306 to pass, while redirecting a second portion of the electromagnetic radiation 334 toward the third MQW structure 312. In some cases, the optical subsystem 332 may include one or more beam-splitting structures, such as one or more gratings 336, 338 or other elements that redirect the second portion of the electromagnetic radiation 334 toward the third MQW structure 312. In some cases, the optical subsystem 332 may include a substrate 340 (e.g., an optically-transmissive cover, which in some cases may be an external cover of a device). In some cases, the one or more gratings 336, 338 (or one or more lenses, other optic elements, coatings, and/or surface treatments) may be formed on, attached to, or applied to the substrate 340.

In operation, the third electrode 328 may be grounded or held at a fixed potential, and the first MQW structure 308 may be forward-biased by a fixed or modulated drive current applied to the first electrode 324. Forward-biasing the first MQW structure 308 may cause the first MQW structure 308 to generate electromagnetic radiation (i.e., lase). The generated electromagnetic radiation may be emitted from the first MQW structure 308. If the emitted electromagnetic radiation 334 reflects or scatters off of a target (e.g., a surface, object, or particle), a portion of the reflected or scattered electromagnetic radiation may be reflected or scattered toward the semiconductor laser 306, and may be received back into (or returned to) the first MQW structure 308. When this occurs, the returned portion of the emitted electromagnetic radiation 334 may self-mix with the electromagnetic radiation that is generated within the first MQW structure 308. The self-mixing leads to changes in the emitted electromagnetic radiation 334.

The changes in the emitted electromagnetic radiation 334 may be detected with a first SMI excess phase, from mixing with a first emission direction of the semiconductor laser 306, by reverse-biasing the second MQW structure 310 with a fixed voltage bias (i.e., the second MQW structure 310 may be reverse-biased and operated as a PD); sensing a photocurrent (a first photocurrent) generated by the second MQW structure 310 (e.g., a photocurrent generated at the second electrode 326); and extracting an SMI signal from the photocurrent. In some cases, the photocurrent may be received and amplified by a first TIA, as described with reference to FIG. 2A.

The changes in the emitted electromagnetic radiation 334 may also be detected with a second SMI excess phase, from mixing with a second emission direction of the semiconductor laser 306, by reverse-biasing the third MQW structure 312 with a fixed voltage bias (i.e., the third MQW structure 312 may be reverse-biased and operated as a second PD); sensing a photocurrent (a second photocurrent) generated by the third MQW structure 312 (e.g., a photocurrent generated at the fourth electrode 330); and extracting an SMI signal from the photocurrent. In some cases, the photocurrent may be received and amplified by a second TIA, as described with reference to FIG. 2A. The first and second TIAs may be coupled to a set of one or more circuit components to generate an SMI signal that includes none (or less) of the noise that is common to the first and second photocurrents, as described with reference to FIG. 2A. To improve the noise mitigation provided by the TIAs and set of one or more circuit components, the second and third MQW structures 310, 312 may be phase-matched.

In some cases, the second and third MQW structures 310, 312 may be formed at the same time, in a same set of epitaxial layers, and then a trench 342 may be etched to electrically separate the second and third MQW structures 310, 312. The trench 342 may be open or filled. Alternatively, the second and third MQW structures 310, 312 may be electrically separated by ion implantation or other means.

In some cases, the second and third MQW structures 310, 312 may be formed at different times. For example, after forming the mesa including the first and second MQW structures 308, 310 and first, second, and third portions 314, 316, 318 of the DBR, a set of epitaxial layers may be formed to define the third MQW structure 312 and fourth portion 320 of a DBR. This alternative method of forming the third MQW structure 312 may allow the second and third MQW structures 310, 312 to be independently tuned.

Regardless of whether the third MQW structure 312 is formed at the same time or at different times with respect to formation of the second MQW structure 310, a fourth MQW structure that is operable as a semiconductor laser (e.g., a VCSEL) may in some cases be formed on the third MQW structure 312. When the fourth MQW structure is formed at the same time, and using the same process as, the first MQW structure 308, the fourth MQW structure, and in some cases the first portion 314 of the DBR, may be removed (e.g., etched away). Alternatively, the fourth MQW structure may be left in place, and may be turned off or reverse-biased when the first MQW structure is forward-biased to generate electromagnetic radiation. In this manner, the third MQW structure 312 may be used to detect an emission of the semiconductor laser 306.

In some cases, one or both of the second and third MQW structures 310, 312 may be alternatively operable to generate a photocurrent (as described above), or to generate electromagnetic radiation contemporaneously with the first MQW structure 308, as described with reference to FIG. 2A.

Figure 3B:
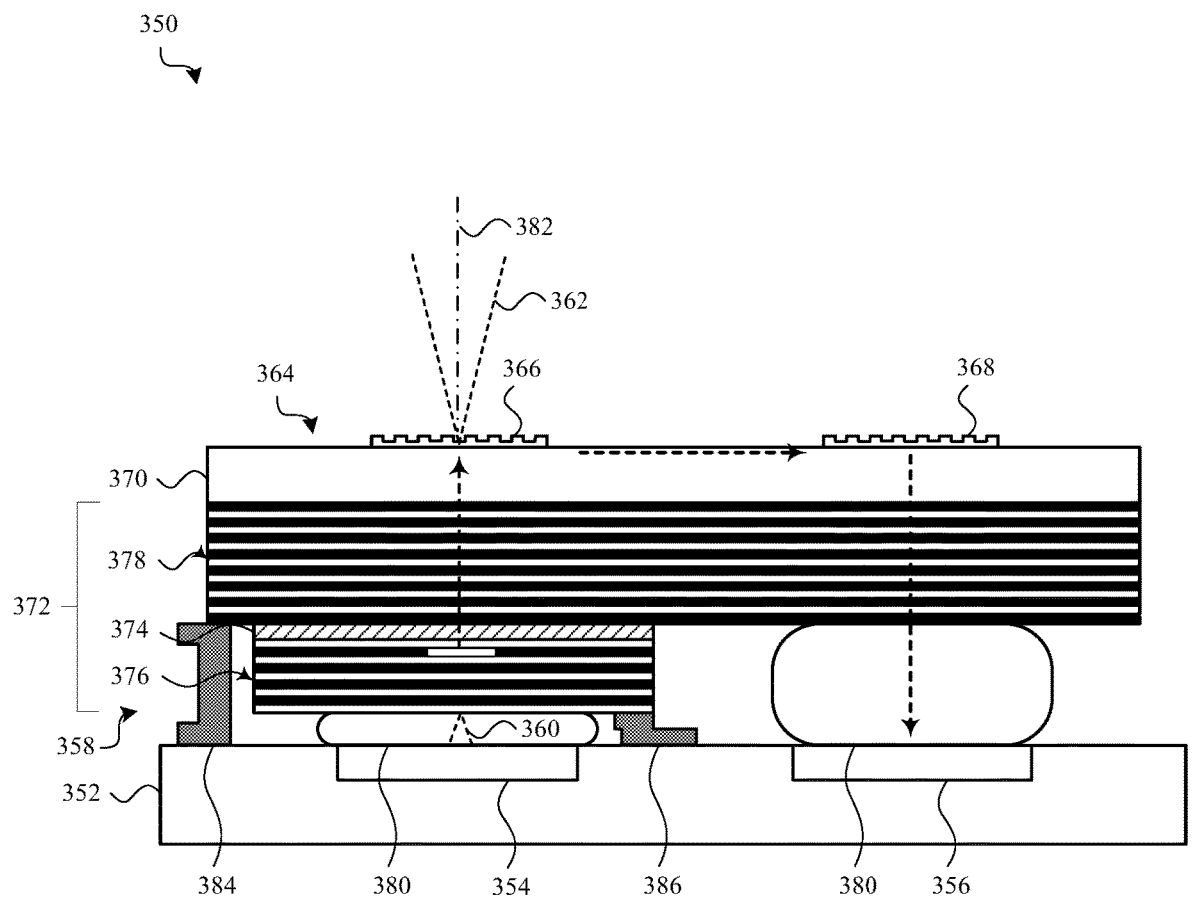
FIG. 3B shows an example of an optical sensor system that includes a semiconductor laser integrated with a pair of in-plane photodetectors, both of which are formed apart from an epitaxial stack that includes the semiconductor laser.

FIG. 3B shows a fourth example of an optical sensor system 350. The optical sensor system 350 includes a substrate 352 on which a first photodetector 354 and a second photodetector 356 are formed (or to which the first and second photodetectors 354, 356 are attached). The second photodetector 356 is laterally offset from the first photodetector 354. In some cases, the substrate 352 may be a silicon (Si) substrate, and the first and second photodetectors may be formed using Si, germanium (Ge), gallium arsenide (GaAs), or another photosensitive medium (e.g., a quantum dot/film, organic medium, and so on).

A semiconductor laser 358 (e.g., a VCSEL) is attached to the substrate 352, aligned with the first photodetector 354 (e.g., an emission axis of the semiconductor laser 358 intersects a surface of the first photodetector 354). The semiconductor laser 358 may be configured to make a first emission 360 of electromagnetic radiation toward the first photodetector 354, and make a second emission 362 in an opposite direction. The second emission 362 may be the primary emission of the semiconductor laser 358.

The second emission 362 may be received by an optical subsystem 364. The optical subsystem 364 may allow a first portion of the second emission to pass, while redirecting a second portion of the second emission 362 toward the second photodetector 356. In some cases, the optical subsystem 364 may include one or more gratings 366, 368 or other elements that redirect the second portion of the electromagnetic radiation 362 toward the third MQW structure 312. In some cases, the optical subsystem 364 may be formed on a substrate 370 (e.g., an optically-transmissive semiconductor substrate 370) on which the semiconductor laser 358 is formed. In some cases, the one or more gratings 366, 368 (or one or more lenses, other optic elements, coatings, and/or surface treatments) may be formed on, attached to, or applied to the substrate 370.

The semiconductor laser 358 may in some cases be defined by an epitaxial stack 372 formed on the substrate 370, and may include a resonant cavity 374 (e.g., an MQW structure) formed within a DBR defined by the epitaxial stack 372. The DBR may include first and second portions 376, 378 formed on opposite sides of the resonant cavity 374. In some cases, a subset of epitaxial layers in the epitaxial stack 372 (e.g., the second portion 378 of the DBR) may extend over the second photodetector 356. The first and second portions 376, 378 of the DBR may be partially transmissive, or have an aperture, to allow electromagnetic radiation generated by the semiconductor laser 358 to escape from the epitaxial stack 372 in the first and second emissions of electromagnetic radiation 360, 362. In some cases, the semiconductor laser 358 may be configured as a VCSEL.

The semiconductor laser 358 may be configured to have a primary emission (i.e., the second emission 362) that is a backside emission. In other words, the semiconductor laser 358 may be configured to operate as a backside emission (BE) device, with most of its optical power being delivered via the second emission 362. However, the semiconductor laser 358 is also configured to operate as a dual emission (DE) device. The substrate 370 and epitaxial stack 372, with included semiconductor laser 358, may be flipped upside down and bonded to the substrate 352 using an optically-transmissive adhesive 380. During the bonding process, an emission axis 382 of the semiconductor laser 358 may be aligned with the first photodetector 354, with the semiconductor laser 358 positioned between the substrate 352 and the substrate 370.

The resonant cavity 374 may be disposed between first and second electrodes 384, 386. Each of the electrodes 384, 386 may be electrically connected to a respective epitaxial layer in the epitaxial stack 372 and a respective conductive trace on the substrate 352.

Each of the first and second photodetectors 354, 356 may be electrically coupled to a set of conductive traces formed on or in the substrate 352.

In operation, the first electrode 384 may be grounded or held at a fixed potential, and the resonant cavity 374 may be forward-biased by a fixed or modulated drive current applied to the second electrode 386. Forward-biasing the resonant cavity 374 may cause the resonant cavity 374 to generate electromagnetic radiation (i.e., lase). The generated electromagnetic radiation may be emitted from the resonant cavity 374 as the first emission 360 and the second emission 362. If the second emission 362 reflects or scatters off of a target (e.g., a surface, object, or particle), a portion of the reflected or scattered electromagnetic radiation may be reflected or scattered toward the semiconductor laser 358, and may be received back into (or returned to) the resonant cavity 374. When this occurs, the returned portion of the emitted electromagnetic radiation 362 may self-mix with the electromagnetic radiation that is generated within the resonant cavity 374. The self-mixing leads to changes in the emitted electromagnetic radiation 360, 362.

The changes in the emitted electromagnetic radiation may be detected with a first SMI excess phase, from mixing with the first emission 360 direction of the semiconductor laser 358, using the first photodetector 354; sensing a photocurrent (a first photocurrent) generated by the first photodetector 354; and extracting an SMI signal from the photocurrent. In some cases, the photocurrent may be received and amplified by a first TIA, as described with reference to FIG. 2A.

The changes in the emitted electromagnetic radiation may also be detected with a second SMI excess phase, from mixing with the second emission 362 direction of the semiconductor laser 358, using the second photodetector 356; sensing a photocurrent (a second photocurrent) generated by the second photodetector 356; and extracting an SMI signal from the photocurrent. In some cases, the photocurrent may be received and amplified by a second TIA, as described with reference to FIG. 2A. The first and second TIAs may be coupled to a set of one or more circuit components to generate an SMI signal that includes none (or less) of the noise that is common to the first and second photocurrents, as described with reference to FIG. 2A. To improve the noise mitigation provided by the TIAs and set of one or more circuit components, the first and second photodetectors 354, 356 may be phase-matched.

Figure 4A:
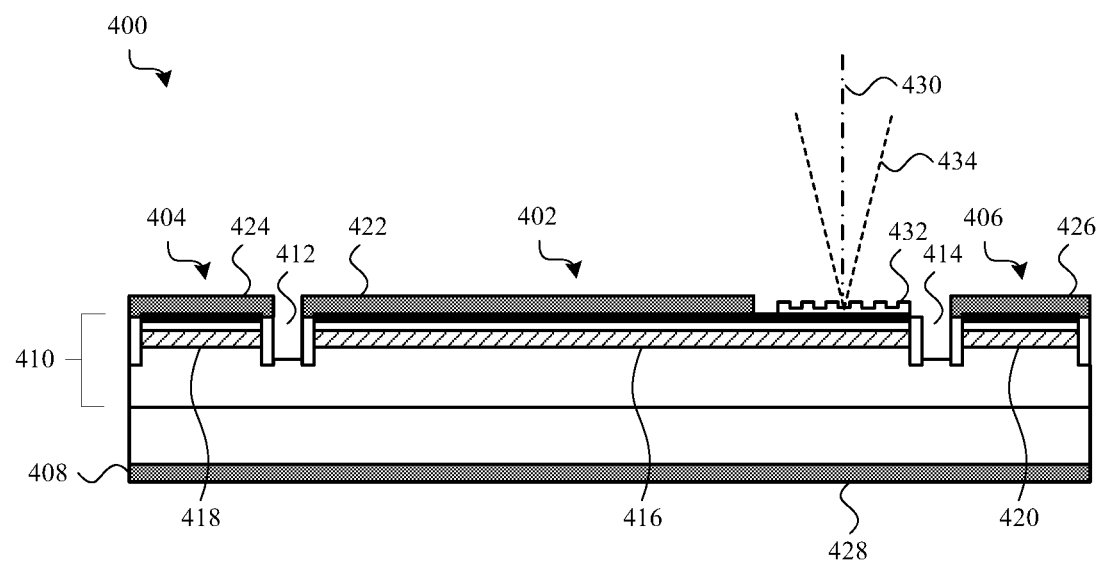
FIGS. 4A and 4B show examples of optical sensor systems that include a semiconductor laser integrated with a pair of in-plane photodetectors, both of which are laterally offset from the semiconductor laser.

FIG. 4A shows a fifth example of an optical sensor system 400. The optical sensor system 400 includes a semiconductor laser 402 integrated with a pair of in-plane photodetectors 404, 406, both of which are laterally offset from the semiconductor laser 402. More particularly, the optical sensor system 400 includes a semiconductor substrate 408 on which a set of epitaxial layers 410 is formed. The structures of the semiconductor laser 402 and photodetectors 404, 406 may in some cases be formed by forming a singular, continuous set of epitaxial layers 410 on the semiconductor substrate 408, and then etching trenches 412, 414 through at least a subset of the epitaxial layers 410 to separate portions of the epitaxial layers 410 that define the semiconductor laser 402 from portions of the epitaxial layers 410 that respectively define the first and second photodetectors 404, 406.

In some cases, the set of epitaxial layers 410 may include a resonant cavity that is subdivided, by the trenches 412, 414, to form a first resonant cavity 416 for the semiconductor laser 402, a second resonant cavity 418 for the first photodetector 404, and a third resonant cavity 420 for the second photodetector 406. In some embodiments, the resonant cavities 416, 418, 420 may include MQW structures. The trenches 412, 414 may in some cases include one or more coatings, fill materials, or surface treatments that 1) make at least the vertical sides of the trenches 412, 414 partially reflective, and 2) resonance-couple the first and second photodetectors 404, 406 to respective ends of the first resonant cavity 416.

A first electrode 422 may be formed on the set of epitaxial layers 410 above the semiconductor laser 402, a second electrode 424 may be formed on the set of epitaxial layers 410 above the first photodetector 404, and a third electrode 426 may be formed on the set of epitaxial layers 410 above the second photodetector 406. A fourth electrode 428, common to all of the semiconductor devices (e.g., the semiconductor laser 402, the first photodetector 404, and the second photodetector 406), may be formed on a side of the semiconductor substrate 408 opposite a side of the semiconductor substrate 408 on which the set of epitaxial layers 410 is formed.

The semiconductor laser 402 may be configured as a horizontal cavity surface-emitting laser (HCSEL), with a resonant cavity 416 that extends parallel to the semiconductor substrate 408, and a primary electromagnetic radiation emission axis 430 that is orthogonal to the resonant cavity 416. In some cases, a diffraction grating 432 or other optic element may be formed or deposited on an emission surface of the semiconductor laser 402. The diffraction grating 432 may aid in emitting and receiving electromagnetic radiation perpendicularly to the resonant cavity 416.

The first photodetector 404 may be positioned adjacent (e.g., near) a first end of the resonant cavity 416, and may be configured to receive a secondary electromagnetic radiation emission of the semiconductor laser 402, which secondary electromagnetic radiation emission leaks through the first end of the resonant cavity 416 because the first end is only partially reflective. The second photodetector 406 may be positioned adjacent (e.g., near) a second end of the resonant cavity 416, and may be configured to receive a tertiary electromagnetic radiation emission of the semiconductor laser 402, which tertiary electromagnetic radiation emission leaks through the second end of the resonant cavity 416 because the second end is only partially reflective. Alternatively, the second photodetector 406 may be configured not to fully absorb the tertiary electromagnetic radiation emission from the semiconductor laser 402, with the tertiary electromagnetic radiation emission emitting out of the outer facet of the second photodetector 406, in an in-plane direction (e.g., in an edge emission, parallel to the semiconductor substrate 408). In these embodiments, the in-plane electromagnetic radiation may be the primary electromagnetic radiation emission, and there may not be an electromagnetic radiation emission orthogonal to the semiconductor substrate 408 (i.e., no emission of electromagnetic radiation orthogonal to the semiconductor substrate).

In operation, the fourth electrode 428 may be grounded or held at a fixed potential, and the first resonant cavity 416 may be forward-biased by a fixed or modulated drive current applied to the first electrode 422. Forward-biasing the first resonant cavity 416 may cause the first resonant cavity 416 to generate electromagnetic radiation (i.e., lase). The generated electromagnetic radiation may be emitted from the first resonant cavity 416 as a primary electromagnetic radiation emission 434. Some of the generated electromagnetic radiation may also leak through the first and second ends of the first resonant cavity 416 to form secondary and tertiary electromagnetic radiation emissions. If the primary electromagnetic radiation emission 434 reflects or scatters off of a target (e.g., a surface, object, or particle), a portion of the reflected or scattered electromagnetic radiation may be reflected or scattered toward the semiconductor laser 402, and may be received back into (or returned to) the first resonant cavity 416. When this occurs, the returned portion of the emitted electromagnetic radiation 434 may self-mix with the electromagnetic radiation that is generated within the first resonant cavity 416. The self-mixing leads to changes in the emitted electromagnetic radiation.

The changes in the emitted electromagnetic radiation may be detected with a first SMI excess phase, from mixing with the secondary electromagnetic radiation emission direction of the semiconductor laser 402, using the first photodetector 404; sensing a photocurrent (a first photocurrent) generated by the first photodetector 404; and extracting an SMI signal from the photocurrent. In some cases, the photocurrent may be received and amplified by a first TIA coupled to the second electrode 424, as described with reference to FIG. 2A.

The changes in the emitted electromagnetic radiation may also be detected with a second SMI excess phase, from mixing with the second electromagnetic radiation emission direction of the semiconductor laser 402, using the second photodetector 406; sensing a photocurrent (a second photocurrent) generated by the second photodetector 406; and extracting an SMI signal from the photocurrent. In some cases, the photocurrent may be received and amplified by a second TIA coupled to the third electrode 428, as described with reference to FIG. 2A. The first and second TIAs may be coupled to a set of one or more circuit components to generate an SMI signal that includes none (or less) of the noise that is common to the first and second photocurrents, as described with reference to FIG. 2A. To improve the noise mitigation provided by the TIAs and set of one or more circuit components, the first and second photodetectors 404, 406 may be phase-matched.

Figure 4B:
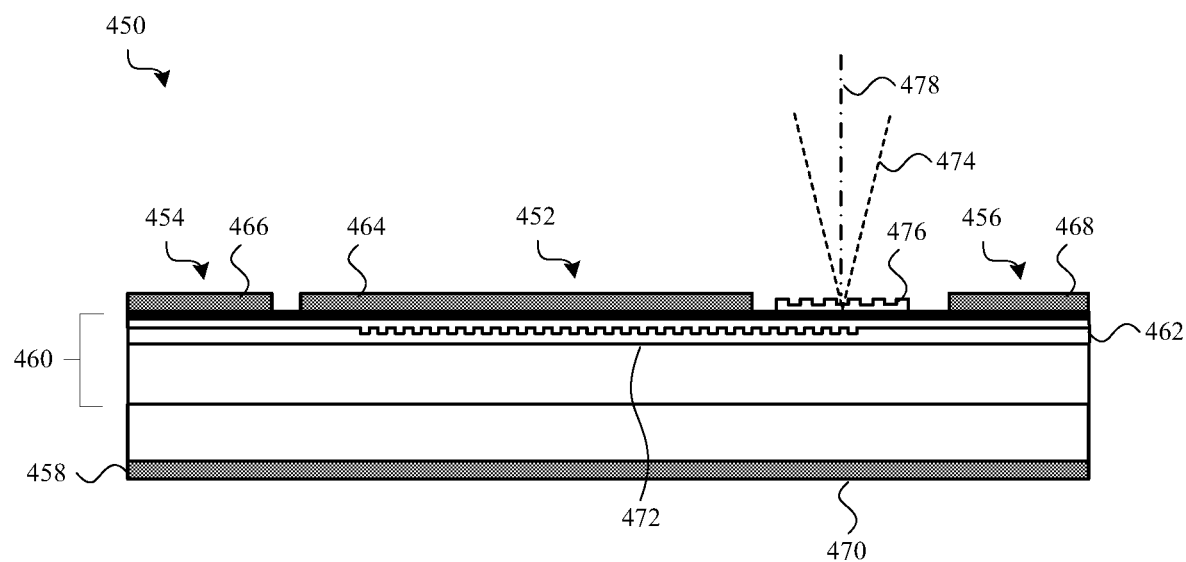

FIG. 4B shows a sixth example of an optical sensor system 450. The optical sensor system 450 includes a semiconductor laser 452 integrated with a pair of in-plane photodetectors 454, 456, both of which are laterally offset from the semiconductor laser 452. More particularly, the optical sensor system 450 includes a semiconductor substrate 458 on which a set of epitaxial layers 460 is formed. The structures of the semiconductor laser 452 and photodetectors 454, 456 may in some cases be formed by forming a singular, continuous set of epitaxial layers 460 on the semiconductor substrate 458, and using a distributed feedback structure within the semiconductor laser 452, and in some cases ion implantation or trenches, to effectively separate portions of the epitaxial layers 460 that define the semiconductor laser 452, the first photodetector 454, and the second photodetector 456. The distributed feedback structure may have changes in refractive index that regulate secondary and tertiary electromagnetic radiation emissions that the semiconductor laser 452 makes toward the first and second photodetectors 454, 456.

In some cases, the set of epitaxial layers 460 may include a singular resonant cavity 462 that is effectively subdivided as a result of the semiconductor laser 452 being a DFB laser.

A first electrode 464 may be formed on the set of epitaxial layers 460 above the semiconductor laser 452, a second electrode 466 may be formed on the set of epitaxial layers 460 above the first photodetector 454, and a third electrode 468 may be formed on the set of epitaxial layers 460 above the second photodetector 456. A fourth electrode 470, common to all of the semiconductor devices (e.g., the semiconductor laser 452, the first photodetector 454, and the second photodetector 456), may be formed on a side of the semiconductor substrate 458 opposite a side of the semiconductor substrate 458 on which the set of epitaxial layers 460 is formed.

The semiconductor laser 452 may be configured as a HCSEL, with a resonant cavity 472 that extends parallel to the semiconductor substrate 458, and a primary electromagnetic radiation emission axis 478 that is orthogonal to the resonant cavity 472. Alternatively, the semiconductor laser 452 may be configured as an edge-emitting laser (EEL) if either of the photodetectors 454, 456 are configured to be only partially absorbing of the in-plane electromagnetic radiation leakage out of the DFB, and if the outer facet of such photodetector is partially transmissive. In some cases, a diffraction grating 476 or other optic element may be formed or deposited on an emission surface of the semiconductor laser 452. The diffraction grating 476 may aid in emitting and receiving electromagnetic radiation perpendicularly to the resonant cavity 472.

The first photodetector 454 may be positioned adjacent a first end of the resonant cavity 472, and may be configured to receive a secondary electromagnetic radiation emission of the semiconductor laser 452, which secondary electromagnetic radiation emission leaks through the first end of the resonant cavity 472 because the first end is only partially reflective. The second photodetector 456 may be positioned adjacent a second end of the resonant cavity 472, and may be configured to receive a tertiary electromagnetic radiation emission of the semiconductor laser 452, which tertiary electromagnetic radiation emission leaks through the second end of the resonant cavity 472 because the second end is only partially reflective.

In operation, the fourth electrode 470 may be grounded or held at a fixed potential, and the resonant cavity 472 may be forward-biased by a fixed or modulated drive current applied to the first electrode 464. Forward-biasing the resonant cavity 472 may cause the resonant cavity 472 to generate electromagnetic radiation (i.e., lase). The generated electromagnetic radiation may be emitted from the resonant cavity 472 as a primary electromagnetic radiation emission 474. Some of the generated electromagnetic radiation may also leak through the first and second ends of the resonant cavity 472 to form secondary and tertiary electromagnetic radiation emissions. If the primary electromagnetic radiation emission 474 reflects or scatters off of a target (e.g., a surface, object, or particle), a portion of the reflected or scattered electromagnetic radiation may be reflected or scattered toward the semiconductor laser 452, and may be received back into (or returned to) the resonant cavity 472. When this occurs, the returned portion of the emitted electromagnetic radiation 474 may self-mix with the electromagnetic radiation that is generated within the resonant cavity 472. The self-mixing leads to changes in the emitted electromagnetic radiation.

The changes in the emitted electromagnetic radiation may be detected with a first SMI excess phase, from mixing with the secondary electromagnetic radiation emission direction of the semiconductor laser 452, using the first photodetector 454; sensing a photocurrent (a first photocurrent) generated by the first photodetector 454; and extracting an SMI signal from the photocurrent. In some cases, the photocurrent may be received and amplified by a first TIA coupled to the second electrode 466, as described with reference to FIG. 2A.

The changes in the emitted electromagnetic radiation may also be detected with a second SMI excess phase, from mixing with the second electromagnetic radiation emission direction of the semiconductor laser 452, using the second photodetector 456; sensing a photocurrent (a second photocurrent) generated by the second photodetector 456; and extracting an SMI signal from the photocurrent. In some cases, the photocurrent may be received and amplified by a second TIA coupled to the third electrode 468, as described with reference to FIG. 2A. The first and second TIAs may be coupled to a set of one or more circuit components to generate an SMI signal that includes none (or less) of the noise that is common to the first and second photocurrents, as described with reference to FIG. 2A. To improve the noise mitigation provided by the TIAs and set of one or more circuit components, the first and second photodetectors 454, 456 may be phase-matched.

Figure 5A:
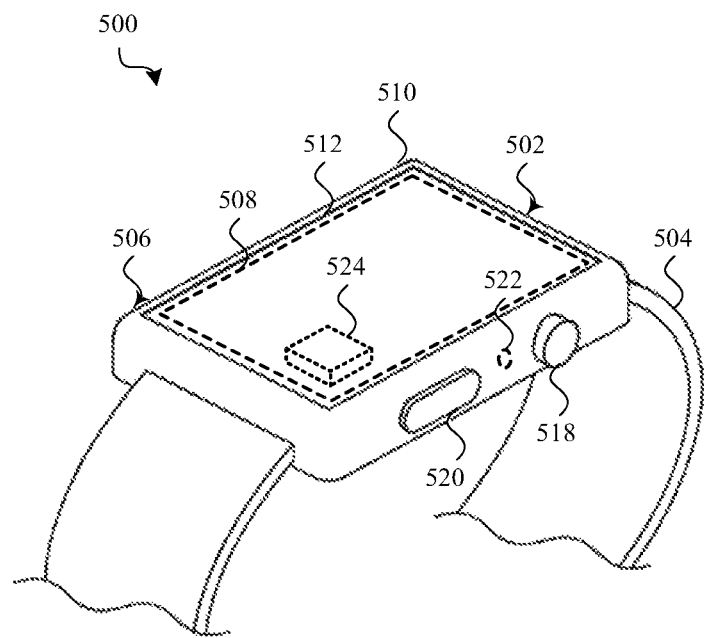
FIGS. 5A and 5B show an example of a device that may include any of the optical sensor systems described with reference to FIG. 1A, 2A, 3A, 3B, 4A, or 4B.
Figure 5B:
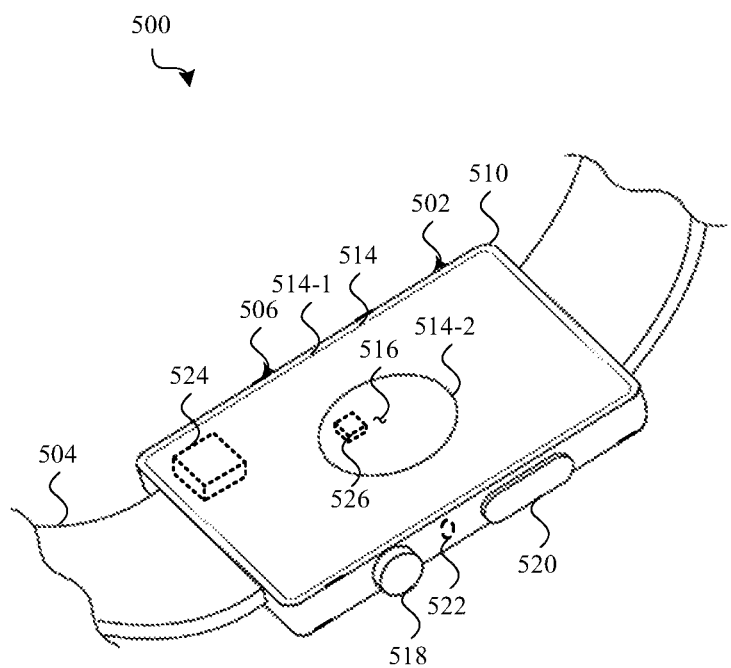

FIGS. 5A and 5B show an example of a device 500 (an electronic device) that may include any of the optical sensor systems described with reference to FIG. 1A, 2A, 3A, 3B, 4A, or 4B. The device's dimensions and form factor, and inclusion of a band 504 (e.g., a wrist band), suggest that the device 500 is an electronic watch, fitness monitor, or health diagnostic device. However, the device 500 could alternatively be any type of wearable device, including an earphone, headset, or glasses/goggles. FIG. 5A shows a front isometric view of the device 500, and FIG. 5B shows a back isometric view of the device 500.

The device 500 may include a body 502 (e.g., a watch body) and a band 504. The body 502 may include an input or selection device, such as a crown 518 or a button 520. The band 504 may be attached to a housing 506 of the body 502, and may be used to attach the body 502 to a body part (e.g., an arm, wrist, leg, ankle, or waist) of a user. The body 502 may include a housing 506 that at least partially surrounds a display 508. In some embodiments, the housing 506 may include a sidewall 510, which sidewall 510 may support a front cover 512 (FIG. 5A) and/or a back cover 514 (FIG. 5B). The front cover 512 may be positioned over the display 508, and may provide a window through which the display 508 may be viewed. In some embodiments, the display 508 may be attached to (or abut) the sidewall 510 and/or the front cover 512. In alternative embodiments of the device 500, the display 508 may not be included and/or the housing 506 may have an alternative configuration.

The display 508 may include one or more light-emitting elements including, for example, light-emitting elements that define a light-emitting diode (LED) display, organic LED (OLED) display, liquid crystal display (LCD), electroluminescent (EL) display, or other type of display. In some embodiments, the display 508 may include, or be associated with, one or more touch and/or force sensors that are configured to detect a touch and/or a force applied to a surface of the front cover 512.

In some embodiments, the sidewall 510 of the housing 506 may be formed using one or more metals (e.g., aluminum or stainless steel), polymers (e.g., plastics), ceramics, or composites (e.g., carbon fiber). The front cover 512 may be formed, for example, using one or more of glass, a crystal (e.g., sapphire), or a transparent polymer (e.g., plastic) that enables a user to view the display 508 through the front cover 512. In some cases, a portion of the front cover 512 (e.g., a perimeter portion of the front cover 512) may be coated with an opaque ink to obscure components included within the housing 506. In some cases, all of the exterior components of the housing 506 may be formed from a transparent material, and components within the device 500 may or may not be obscured by an opaque ink or opaque structure within the housing 506.

The back cover 514 may be formed using the same material(s) that are used to form the sidewall 510 or the front cover 512. In some cases, the back cover 514 may be part of a monolithic element that also forms the sidewall 510. In other cases, and as shown, the back cover 514 may be a multi-part back cover, such as a back cover having a first back cover portion 514-1 attached to the sidewall 510 and a second back cover portion 514-2 attached to the first back cover portion 514-1. The second back cover portion 514-2 may in some cases have a circular perimeter and an arcuate exterior surface 516 (i.e., an exterior surface 516 having an arcuate profile).

The front cover 512, back cover 514, or first back cover portion 514-1 may be mounted to the sidewall 510 using fasteners, adhesives, seals, gaskets, or other components. The second back cover portion 514-2, when present, may be mounted to the first back cover portion 514-1 using fasteners, adhesives, seals, gaskets, or other components.

A display stack or device stack (hereafter referred to as a "stack") including the display 508 may be attached (or abutted) to an interior surface of the front cover 512 and extend into an interior volume of the device 500. In some cases, the stack may include a touch sensor (e.g., a grid of capacitive, resistive, strain-based, ultrasonic, or other type of touch sensing elements), or other layers of optical, mechanical, electrical, or other types of components. In some cases, the touch sensor (or part of a touch sensor system) may be configured to detect a touch applied to an outer surface of the front cover 512 (e.g., to a display surface of the device 500).

In some cases, a force sensor (or part of a force sensor system) may be positioned within the interior volume below and/or to the side of the display 508 (and in some cases within the device stack). The force sensor (or force sensor system) may be triggered in response to the touch sensor detecting one or more touches on the front cover 512 (or a location or locations of one or more touches on the front cover 512), and may determine an amount of force associated with each touch, or an amount of force associated with the collection of touches as a whole. The force sensor (or force sensor system) may alternatively trigger operation of the touch sensor (or touch sensor system), or may be used independently of the touch sensor (or touch sensor system).

The device 500 may include various sensors. In some embodiments, the device 500 may have a port 522 (or set of ports) on a side of the housing 506 (or elsewhere), and an ambient pressure sensor, ambient temperature sensor, internal/external differential pressure sensor, gas sensor, particulate matter concentration sensor, or air quality sensor may be positioned in or near the port(s) 522.

In some cases, one or more skin-facing sensors 526 may be included within the device 500. The skin-facing sensor(s) 526 may emit or transmit signals through the housing 506 (or back cover 514) and/or receive signals or sense conditions through the housing 506 (or back cover 514). For example, in some embodiments, one or more such sensors may include a number of electromagnetic radiation emitters (e.g., visible light and/or IR emitters) and/or a number of electromagnetic radiation detectors (e.g., visible light and/or IR detectors, such as any of the electromagnetic radiation detectors described herein). The sensors may be used, for example, to acquire biological information from the wearer or user of the device 500 (e.g., a heart rate, respiration rate, blood pressure, blood flow rate, blood oxygenation, blood glucose level, and so on), or to determine a status of the device 500 (e.g., whether the device 500 is being worn or a tightness of the device 500).

The device 500 may include circuitry 524 (e.g., a processor and/or other components) configured to determine or extract, at least partly in response to signals received directly or indirectly from one or more of the device's sensors, and by way of example, biological parameters of the device's user, an input provided by the user, a status of the device 500 or its environment, and/or a position (or other aspects) of objects, particles, surfaces, or a user. The biological parameters may include, for example, a biometric, heart rate, respiration rate, blood pressure, blood flow rate, blood oxygenation, blood glucose level, and so on. In some embodiments, the circuitry 524 may be configured to convey the determined or extracted parameters, inputs, or statuses via an output device of the device 500. For example, the circuitry 524 may cause the indication(s) to be displayed on the display 508, indicated via audio or haptic outputs, transmitted via a wireless communications interface or other communications interface, and so on. The circuitry 524 may also or alternatively maintain or alter one or more settings, functions, or aspects of the device 500, including, in some cases, what is displayed on the display 508.

In some embodiments, one of the optical sensor systems described herein may be incorporated into the crown 518, button 520, skin-facing sensor 526, or band 504 of the device 500; integrated with the display 508 or positioned behind the display 508; and so on. The optical sensor system may be used, for example, to determine biological parameters of the device's user, an input provided by the user, a status of the device 500 or its environment, and/or a position (or other aspects) of objects, particles, surfaces, or a user.

Figure 6A:
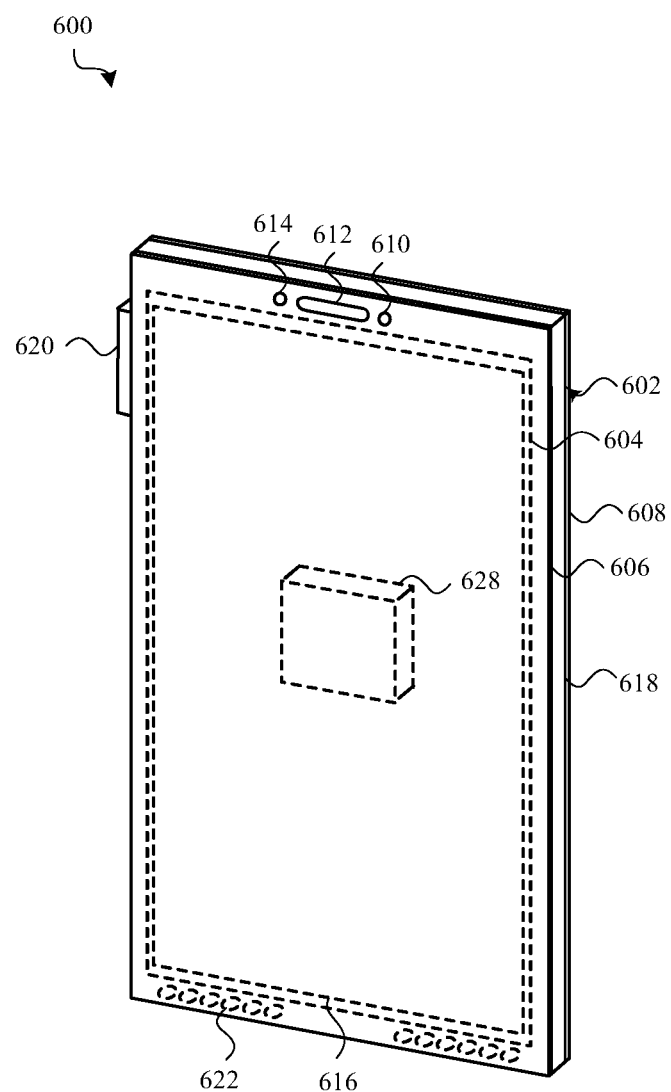
FIGS. 6A and 6B show another example of a device that may include any of the optical sensor systems described with reference to FIG. 1A, 2A, 3A, 3B, 4A, or 4B.
Figure 6B:
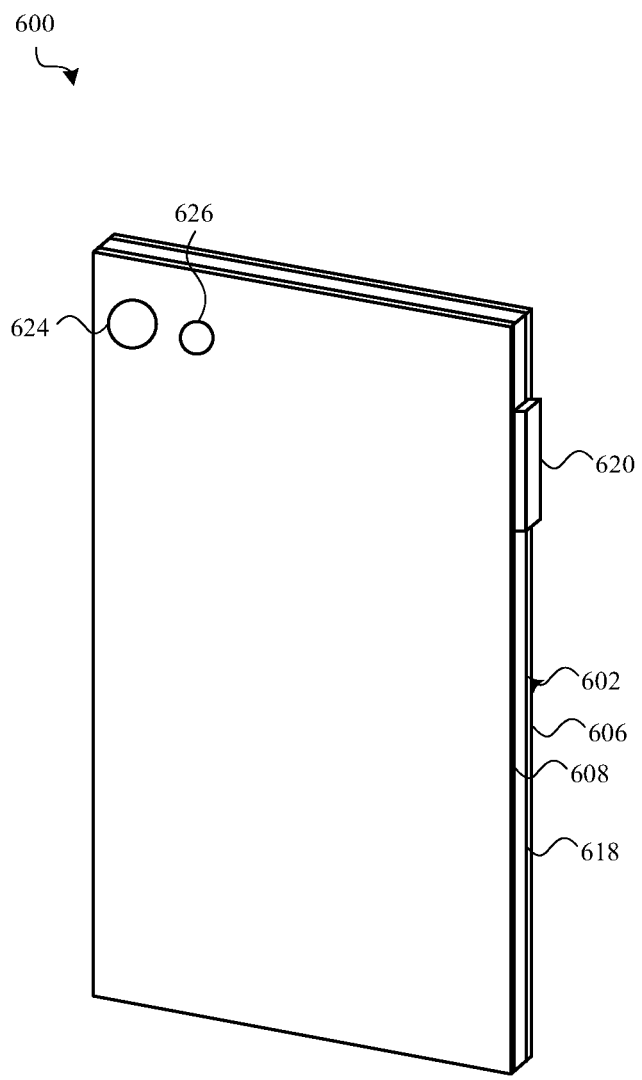

FIGS. 6A and 6B show another example of a device 600 (an electronic device) that may include any of the optical sensor systems described with reference to FIG. 1A, 2A, 3A, 3B, 4A, or 4B. The device's dimensions and form factor, including the ratio of the length of its long sides to the length of its short sides, suggest that the device 600 is a mobile phone (e.g., a smartphone). However, the device's dimensions and form factor are arbitrarily chosen, and the device 600 could alternatively be any portable electronic device including, for example, a mobile phone, tablet computer, portable computer, portable music player, portable terminal, vehicle navigation system, robot navigation system, or other portable or mobile device. The device 600 could also be a device that is semi-permanently located (or installed) at a single location (e.g., a door lock, thermostat, refrigerator, or other appliance). FIG. 6A shows a front isometric view of the device 600, and FIG. 6B shows a rear isometric view of the device 600. The device 600 may include a housing 602 that at least partially surrounds a display 604. The housing 602 may include or support a front cover 606 or a rear cover 608. The front cover 606 may be positioned over the display 604, and may provide a window through which the display 604 (including images displayed thereon) may be viewed by a user. In some embodiments, the display 604 may be attached to (or abut) the housing 602 and/or the front cover 606.

The display 604 may include one or more light-emitting elements or pixels, and in some cases may be an LED display, an OLED display, an LCD, an EL display, a laser projector, or another type of electronic display. In some embodiments, the display 604 may include, or be associated with, one or more touch and/or force sensors that are configured to detect a touch and/or a force applied to a surface of the front cover 606.

The various components of the housing 602 may be formed from the same or different materials. For example, a sidewall 618 of the housing 602 may be formed using one or more metals (e.g., stainless steel), polymers (e.g., plastics), ceramics, or composites (e.g., carbon fiber). In some cases, the sidewall 618 may be a multi-segment sidewall including a set of antennas. The antennas may form structural components of the sidewall 618. The antennas may be structurally coupled (to one another or to other components) and electrically isolated (from each other or from other components) by one or more non-conductive segments of the sidewall 618. The front cover 606 may be formed, for example, using one or more of glass, a crystal (e.g., sapphire), or a transparent polymer (e.g., plastic) that enables a user to view the display 604 through the front cover 606. In some cases, a portion of the front cover 606 (e.g., a perimeter portion of the front cover 606) may be coated with an opaque ink to obscure components included within the housing 602. The rear cover 608 may be formed using the same material(s) that are used to form the sidewall 618 or the front cover 606, or may be formed using a different material or materials. In some cases, the rear cover 608 may be part of a monolithic element that also forms the sidewall 618 (or in cases where the sidewall 618 is a multi-segment sidewall, those portions of the sidewall 618 that are non-conductive). In still other embodiments, all of the exterior components of the housing 602 may be formed from a transparent material, and components within the device 600 may or may not be obscured by an opaque ink or opaque structure within the housing 602.

The front cover 606 may be mounted to the sidewall 618 to cover an opening defined by the sidewall 618 (i.e., an opening into an interior volume in which various electronic components of the device 600, including the display 604, may be positioned). The front cover 606 may be mounted to the sidewall 618 using fasteners, adhesives, seals, gaskets, or other components.

A display stack or device stack (hereafter referred to as a "stack") including the display 604 (and in some cases the front cover 606) may be attached (or abutted) to an interior surface of the front cover 606 and extend into the interior volume of the device 600. In some cases, the stack may also include a touch sensor (e.g., a grid of capacitive, resistive, strain-based, ultrasonic, or other type of touch sensing elements), or other layers of optical, mechanical, electrical, or other types of components. In some cases, the touch sensor (or part of a touch sensor system) may be configured to detect a touch applied to an outer surface of the front cover 606 (e.g., to a display surface of the device 600).

The stack may also include one or an array of sensors 616, with the sensors positioned in front of or behind, or interspersed with, the light-emitting elements of the display 604. In some cases, an array of sensors 616 may extend across an area equal in size to the area of the display 604. Alternatively, the array of sensors 616 may extend across an area that is smaller than or greater than the area of the display 604, or may be positioned entirely adjacent the display 604. Although the array of sensors 616 is shown to have a rectangular boundary, the array could alternatively have a boundary with a different shape, including, for example, an irregular shape. The array of sensors 616 may be variously configured as an ambient light sensor, a light-emitting element (e.g., OLED) health sensor (e.g., age sensor), a touch sensor, a proximity sensor, a health sensor, a biometric sensor (e.g., a fingerprint sensor or facial recognition sensor), a camera, a depth sensor, and so on. The array of sensors 616 may also or alternatively function as a proximity sensor, for determining whether an object (e.g., a finger, face, or stylus) is proximate to the front cover 606. In some embodiments, the array of sensors 616 may provide the touch sensing capability (i.e., touch sensor) of the stack.

In some cases, a force sensor (or part of a force sensor system) may be positioned within the interior volume below and/or to the side of the display 604 (and in some cases within the stack). The force sensor (or force sensor system) may be triggered in response to the touch sensor detecting one or more touches on the front cover 606 (or indicating a location or locations of one or more touches on the front cover 606), and may determine an amount of force associated with each touch, or an amount of force associated with the collection of touches as a whole.

As shown primarily in FIG. 6A, the device 600 may include various other components. For example, the front of the device 600 may include one or more front-facing cameras 610 (including one or more image sensors), speakers 612, microphones, or other components 614 (e.g., audio, imaging, and/or sensing components) that are configured to transmit or receive signals to/from the device 600. In some cases, a front-facing camera 610, alone or in combination with other sensors, may be configured to operate as a bio-authentication or facial recognition sensor. Additionally or alternatively, the array of sensors 616 may be configured to operate as a front-facing camera 610, a bio-authentication sensor, or a facial recognition sensor.

The device 600 may also include buttons or other input devices positioned along the sidewall 618 and/or on a rear surface of the device 600. For example, a volume button or multipurpose button 620 may be positioned along the sidewall 618, and in some cases may extend through an aperture in the sidewall 618. The sidewall 618 may include one or more ports 622 that allow air, but not liquids, to flow into and out of the device 600. In some embodiments, one or more sensors may be positioned in or near the port(s) 622. For example, an ambient pressure sensor, ambient temperature sensor, internal/external differential pressure sensor, gas sensor, particulate matter concentration sensor, or air quality sensor may be positioned in or near a port 622.

In some embodiments, the rear surface of the device 600 may include a rear-facing camera 624. A flash or light source 626 may also be positioned along the rear of the device 600 (e.g., near the rear-facing camera). In some cases, the rear surface of the device 600 may include multiple rear-facing cameras.

In some cases, the sensor(s) 616, the front-facing camera 610, the rear-facing camera 624, the button 620, and/or other sensors positioned on the front, back, or sides of the device 600 may emit or transmit optical signals through the housing 602 (including the front cover 606, rear cover 608, or sidewall 618) and/or receive signals or sense conditions through the housing 602. Optical signals may also be transmitted and received through the button 620. In some embodiments, the sensor(s) 616, the front-facing camera 610, the rear-facing camera 624, the button 620, or the display 604 may include, or be integrated with, one of the optical sensor systems described herein. The optical sensor system may be used, for example, to determine biological parameters of the device's user, an input provided by the user, a status of the device 600 or its environment, and/or a position (or other aspects) of objects, particles, surfaces, or a user.

The device 600 may include circuitry 628 (e.g., a processor and/or other components) configured to determine or extract, at least partly in response to signals received directly or indirectly from one or more of the device's sensors, biological parameters of the device's user, a status of the device 600, parameters of an environment of the device 600 (e.g., air quality), or a composition of a target or object, for example. In some embodiments, the circuitry 628 may be configured to convey the determined or extracted parameters or statuses via an output device of the device 600. For example, the circuitry 628 may cause the indication(s) to be displayed on the display 604, indicated via audio or haptic outputs, transmitted via a wireless communications interface or other communications interface, and so on. The circuitry 628 may also or alternatively maintain or alter one or more settings, functions, or aspects of the device 600, including, in some cases, what is displayed on the display 604.

Figure 7:
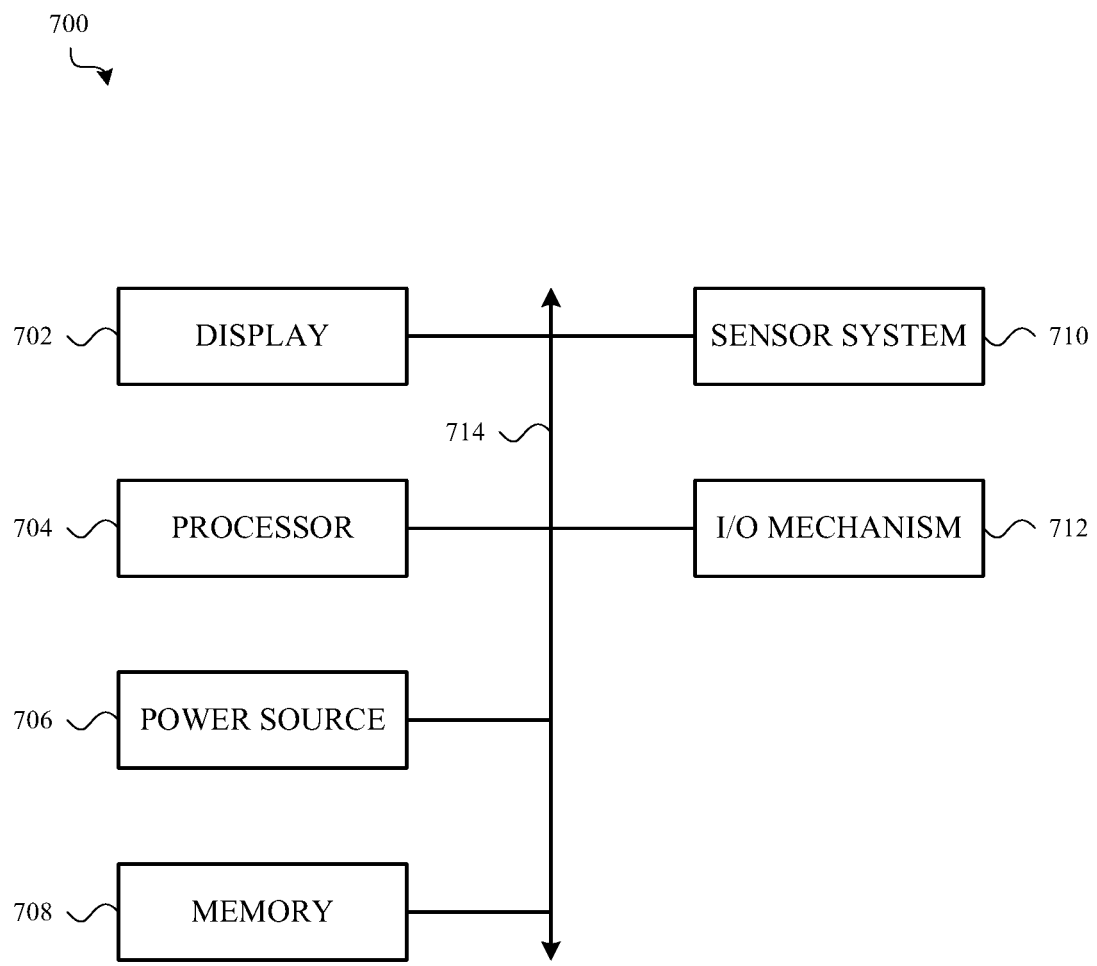
FIG. 7 shows an example block diagram of an electronic device that may include any of the optical sensor systems described with reference to FIG. 1A, 2A, 3A, 3B, 4A, or 4B.

FIG. 7 shows an example block diagram of an electronic device 700, which in some cases may be the electronic device described with reference to FIG. 5A-5B or 6A-6B. Electronic device 700 may include an electronic display 702 (e.g., a light-emitting display), a processor 704, a power source 706, a memory 708 or storage device, a sensor system 710, and/or an input/output (I/O) mechanism 712 (e.g., an input/output device, input/output port, or haptic input/output interface). The processor 704 may control some or all of the operations of the electronic device 700. The processor 704 may communicate, either directly or indirectly, with some or all of the other components of the electronic device 700. For example, a system bus or other communication mechanism 714 can provide communication between the electronic display 702, the processor 704, the power source 706, the memory 708, the sensor system 710, and the I/O mechanism 712.

The processor 704 may be implemented as any electronic device capable of processing, receiving, or transmitting data or instructions, whether such data or instructions is in the form of software or firmware or otherwise encoded. For example, the processor 704 may include a microprocessor, a central processing unit (CPU), an ASIC, a digital signal processor (DSP), a controller, or a combination of such devices. As described herein, the term "processor" is meant to encompass a single processor or processing unit, multiple processors, multiple processing units, or other suitably configured computing element or elements. In some cases, the processor 704 may provide part or all of the processing system or processor described herein.

It should be noted that the components of the electronic device 700 can be controlled by multiple processors. For example, select components of the electronic device 700 (e.g., the sensor system 710) may be controlled by a first processor and other components of the electronic device 700 (e.g., the electronic display 702) may be controlled by a second processor, where the first and second processors may or may not be in communication with each other.

The power source 706 can be implemented with any device capable of providing energy to the electronic device 700. For example, the power source 706 may include one or more batteries or rechargeable batteries. Additionally or alternatively, the power source 706 may include a power connector or power cord that connects the electronic device 700 to another power source, such as a wall outlet.

The memory 708 may store electronic data that can be used by the electronic device 700. For example, the memory 708 may store electrical data or content such as, for example, audio and video files, documents and applications, device settings and user preferences, timing signals, control signals, instructions, and/or data structures or databases. The memory 708 may include any type of memory. By way of example only, the memory 708 may include random access memory, read-only memory, Flash memory, removable memory, other types of storage elements, or combinations of such memory types.

The electronic device 700 may also include one or more sensor systems 710 positioned almost anywhere on the electronic device 700. In some cases, the sensor systems 710 may include one or more of the optical sensor systems described herein. The sensor system(s) 710 may be configured to sense one or more types of parameters, such as but not limited to, vibration; light; touch; force; heat; movement; relative motion; biometric data (e.g., biological parameters) of a user; air quality; proximity; position; connectedness; surface quality; and so on. By way of example, the sensor system(s) 710 may include an SMI sensor, a heat sensor, a position sensor, a light or optical sensor, an accelerometer, a pressure transducer, a gyroscope, a magnetometer, a health monitoring sensor, and an air quality sensor, and so on. Additionally, the one or more sensor systems 710 may utilize any suitable sensing technology, including, but not limited to, interferometric, magnetic, capacitive, ultrasonic, resistive, optical, acoustic, piezoelectric, or thermal technologies.

The I/O mechanism 712 may transmit or receive data from a user or another electronic device. The I/O mechanism 712 may include the electronic display 702, a touch sensing input surface, a crown, one or more buttons (e.g., a graphical user interface "home" button), one or more cameras (including an under-display camera), one or more microphones or speakers, one or more ports such as a microphone port, and/or a keyboard. Additionally or alternatively, the I/O mechanism 712 may transmit electronic signals via a communications interface, such as a wireless, wired, and/or optical communications interface. Examples of wireless and wired communications interfaces include, but are not limited to, cellular and Wi-Fi communications interfaces.

The foregoing description, for purposes of explanation, uses specific nomenclature to provide a thorough understanding of the described embodiments. However, it will be apparent to one skilled in the art, after reading this description, that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art, after reading this description, that many modifications and variations are possible in view of the above teachings.

As described above, one aspect of the present technology may be the gathering and use of data available from various sources. The present disclosure contemplates that, in some instances, this gathered data may include personal information data that uniquely identifies or can be used to identify, locate, or contact a specific person. Such personal information data can include, for example, biometric data (e.g., fingerprint data), health data, and data linked thereto (e.g., demographic data, location-based data, telephone numbers, email addresses, home addresses, data or records relating to a user's health or level of fitness (e.g., vital signs measurements, medication information, exercise information), date of birth, or any other identifying or personal information).

The present disclosure recognizes that the use of such personal information data, in the present technology, can be used to the benefit of users. For example, the personal information data can be used to authenticate a user to access their device, or gather performance metrics for the user's interaction with an augmented or virtual world. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data may be governed by federal and/or state laws, such as the Health Insurance Portability and Accountability Act (HIPAA); whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, in the case of advertisement delivery services, the present technology can be configured to allow users to select to "opt in" or "opt out" of participation in the collection of personal information data during registration for services or anytime thereafter. In another example, users can select not to provide data to targeted content delivery services. In yet another example, users can select to limit the length of time data is maintained or entirely prohibit the development of a baseline profile for the user. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data at a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, content can be selected and delivered to users by inferring preferences based on non-personal information data or a bare minimum amount of personal information, such as the content being requested by the device associated with a user, other non-personal information available to the content delivery services, or publicly available information.

What is claimed is:

1. An optical sensor system, comprising:
   a semiconductor substrate;
   a set of epitaxial layers formed on the semiconductor substrate and defining,
   a semiconductor laser having a first multiple quantum well (MQW) structure, wherein electromagnetic radiation is generated by the first MQW structure, emitted from the first MQW structure, and self-mixed with a portion of the emitted electromagnetic radiation that is returned to the first MQW structure;
   a second MQW structure, positioned on a first side of the first MQW structure and operable to generate a first photocurrent responsive to detecting a first emission of the semiconductor laser; and
   a third MQW structure, positioned on a second side of the first MQW structure and operable to generate a second photocurrent responsive to detecting a second emission of the semiconductor laser, the second side opposite the first side; and
   a circuit configured to generate a self-mixing interferometry (SMI) signal by combining the first photocurrent and the second photocurrent.

2. The optical sensor system of claim 1, wherein the first MQW structure, the second MQW structure, and the third MQW structure are disposed along an emission axis of the semiconductor laser.

3. The optical sensor system of claim 1, wherein:
   the semiconductor laser is a vertical cavity surface-emitting laser (VCSEL); and
   the VCSEL comprises a distributed Bragg reflector (DBR) in which the first MQW structure and the second MQW structure are formed.

4. An optical sensor system, comprising:
   a semiconductor substrate;
   a set of epitaxial layers formed on the semiconductor substrate and defining,
   a semiconductor laser having a first multiple quantum well (MQW) structure, wherein electromagnetic radiation is generated by the first MQW structure, emitted from the first MQW structure, and self-mixed with a portion of the emitted electromagnetic radiation that is returned to the first MQW structure;
   a second MQW structure operable to generate a first photocurrent responsive to detecting a first emission of the semiconductor laser; and
   a third MQW structure operable to generate a second photocurrent responsive to detecting a second emission of the semiconductor laser; and
   a circuit configured to generate a self-mixing interferometry (SMI) signal by combining the first photocurrent and the second photocurrent; wherein,
   the second MQW structure and the third MQW structure share a same set of one or more epitaxial layers.

5. The optical sensor system of claim 1, wherein the circuit comprises:
   a first transimpedance amplifier (TIA) configured to receive the first photocurrent;
   a second TIA configured to receive the second photocurrent; and
   a set of one or more circuit components configured to combine a first output of the first TIA and a second output of the second TIA.

6. The optical sensor system of claim 1, wherein the second MQW structure is alternatively operable to,
   generate the first photocurrent; or
   generate electromagnetic radiation contemporaneously with the first MQW structure.

7. The optical sensor system of claim 1, wherein the first MQW structure and the second MQW structure are phase-matched.

8. An optical sensor system, comprising:
   a substrate;
   a first photodetector on the substrate;
   a second photodetector on the substrate, laterally offset from the first photodetector;
   an epitaxial stack;
   a semiconductor laser formed in an epitaxial stack, the epitaxial stack attached to the substrate, the semiconductor laser aligned with the first photodetector and configured to make a first emission of electromagnetic radiation toward the first photodetector, the semiconductor laser having a resonant cavity in which emitted electromagnetic radiation and returned electromagnetic radiation is self-mixed;
   an optical subsystem configured to,
   receive a second emission of the semiconductor laser; and
   redirect a portion of the second emission toward the second photodetector; and
   a noise-mitigating self-mixing interferometry (SMI) signal channel configured to combine a first photocurrent from the first photodetector and a second photocurrent from the second photodetector; wherein,
   the first photodetector is outside of the epitaxial stack.

9. The optical sensor system of claim 8, wherein a set of epitaxial layers in the epitaxial stack extends over the second photodetector.

10. The optical sensor system of claim 8, wherein the optical subsystem comprises at least one grating that helps redirect the portion of the second emission toward the second photodetector.

11. The optical sensor system of claim 8, wherein:
   the substrate is a first substrate;
   the semiconductor laser is formed on a second substrate, with the first substrate positioned on a first side of the semiconductor laser and the second substrate positioned on a second side of the semiconductor laser; and at least a part of the optical subsystem is formed on the second substrate.

12. An optical sensor system, comprising:
a semiconductor substrate;
a set of epitaxial layers formed on the substrate and defining,
   a semiconductor laser having a resonant cavity parallel to the semiconductor substrate and parallel or orthogonal to a primary electromagnetic radiation emission axis of the semiconductor laser;
   a first photodetector positioned adjacent a first end of the resonant cavity and configured to receive a secondary electromagnetic radiation emission of the semiconductor laser; and
   a second photodetector positioned adjacent a second end of the resonant cavity and configured to receive a tertiary electromagnetic radiation emission of the semiconductor laser; and
a circuit configured to generate an SMI signal by combining a first photocurrent generated by the first photodetector and a second photocurrent generated by the second photodetector; wherein,
the first photocurrent and the second photocurrent have opposite SMI excess phases.

13. The optical sensor system of claim 12, wherein:
the resonant cavity is a first resonant cavity; and
the set of epitaxial layers comprises a multiple quantum well structure, subdivided between,
   the first resonant cavity of the semiconductor laser;
   a second resonant cavity of the first photodetector; and
   a third resonant cavity of the second photodetector.

14. The optical sensor system of claim 12, wherein:
the first photodetector is separated from the semiconductor laser by a trench extending through at least a subset of epitaxial layers in the set of epitaxial layers.

15. The optical sensor system of claim 14, further comprising:
   at least one of a coating, a fill material, or a surface treatment within the trench; wherein,
   the first photodetector is resonance-coupled to the semiconductor laser.

16. The optical sensor system of claim 12, wherein the semiconductor laser is a distributed feedback laser.

17. The optical sensor system of claim 16, wherein the resonant cavity of the distributed feedback laser has periodic changes in refractive index that regulate secondary electromagnetic radiation emission received by the first photodetector.

18. The optical sensor system of claim 4, wherein:
the second MQW structure is disposed along an emission axis of the semiconductor laser; and
the third MQW structure does not intersect the emission axis of the semiconductor laser.

19. The optical sensor system of claim 4, wherein the circuit comprises:
   a first transimpedance amplifier (TIA) configured to receive the first photocurrent;
   a second TIA configured to receive the second photocurrent; and
   a set of one or more circuit components configured to combine a first output of the first TIA and a second output of the second TIA.

20. An optical sensor system, comprising:
a substrate;
a first photodetector on the substrate;
a second photodetector on the substrate, laterally offset from the first photodetector;
a semiconductor laser attached to the substrate, the semiconductor laser aligned with the first photodetector and configured to make a first emission of electromagnetic radiation toward the first photodetector, the semiconductor laser having a resonant cavity in which emitted electromagnetic radiation and returned electromagnetic radiation is self-mixed;
an optical subsystem comprising at least one grating and configured to,
   receive a second emission of the semiconductor laser; and
   redirect a portion of the second emission toward the second photodetector, the redirection occurring at least in part because of the at least one grating; and
a noise-mitigating self-mixing interferometry (SMI) signal channel configured to combine a first photocurrent from the first photodetector and a second photocurrent from the second photodetector.

* * * * *